US012660638B2

(12) United States Patent
Davis et al.

(10) Patent No.: US 12,660,638 B2
(45) Date of Patent: Jun. 16, 2026

(54) LAYERED MOLDED DIRECT CONTACT AND DIELECTRIC STRUCTURE AND METHOD FOR MAKING THE SAME

(71) Applicant: Deca Technologies USA, Inc., Tempe, AZ (US)

(72) Inventors: Robin Davis, Vancouver, WA (US); Timothy L. Olson, Phoenix, AZ (US); Clifford Sandstrom, Richfield, MN (US); Craig Bishop, Scottsdale, AZ (US); Paul R. Hoffman, San Diego, CA (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/410,619

(22) Filed: Jan. 11, 2024

(65) Prior Publication Data
US 2024/0243089 A1     Jul. 18, 2024

Related U.S. Application Data

(60) Provisional application No. 63/480,094, filed on Jan. 16, 2023.

(51) Int. Cl.
*H10W 70/09*     (2026.01)
*H10W 70/60*     (2026.01)
(Continued)

(52) U.S. Cl.
CPC ........... *H10W 70/09* (2026.01); *H10W 70/60* (2026.01); *H10W 74/01* (2026.01); *H10W 74/111* (2026.01)

(58) Field of Classification Search
CPC .. H10W 74/00–481; H10W 70/60–699; H01L 23/28–3192; H01L 23/498–498894; H01L 23/538–5389
See application file for complete search history.

(56) References Cited

U.S. PATENT DOCUMENTS

| | | | |
|---|---|---|---|
| 5,570,274 A | 10/1996 | Saito | |
| 5,790,384 A | 8/1998 | Ahmad | |

(Continued)

FOREIGN PATENT DOCUMENTS

| | | |
|---|---|---|
| CN | 104253105 | 12/2014 |
| CN | 105144367 | 12/2015 |

(Continued)

OTHER PUBLICATIONS

Anandan, Ramasamy et al. "Embedded Wafer Level BGA (EWLB)—Extra-Small and ELGA Packages." Electronics Packaging Technology Conference (EPTC), 2011. pp. 412-416.

(Continued)

*Primary Examiner* — Marcos D. Pizarro
(74) *Attorney, Agent, or Firm* — Booth Udall, PLC; Kenneth C. Booth

(57) ABSTRACT

A method of making a semiconductor assembly may include providing a semiconductor component disposed within a first encapsulant, the encapsulant being disposed around and contacting at least four side surfaces of the semiconductor component and disposed over frontside of the semiconductor component. A first layered structure may be formed as a build-up interconnect structure over the encapsulant and over the semiconductor component. The first layered structure may comprise a first conductive layer formed over the first encapsulant, a first dielectric formed over the first conductive layer, and a second encapsulant disposed over first conductive layer and over first dielectric. An upper surface of the second encapsulant may be planarized to create a flat surface on which to form additional structures, such as a second layered structure or a package interconnect.

20 Claims, 18 Drawing Sheets

(51) Int. Cl.
  *H10W 74/01*   (2026.01)
  *H10W 74/10*   (2026.01)

(56)           References Cited

U.S. PATENT DOCUMENTS

| | | | |
|---|---|---|---|
| 6,121,065 | A | 9/2000 | Wong |
| 6,133,626 | A | 10/2000 | Hawke |
| 6,294,406 | B1 | 9/2001 | Bertin |
| 7,456,496 | B2 | 11/2008 | Hwee |
| 7,476,980 | B2 | 1/2009 | Rebibis |
| 7,569,422 | B2 | 8/2009 | Lin |
| 7,829,380 | B2 | 11/2010 | Irsigler |
| 8,018,036 | B2 | 9/2011 | Goh |
| 8,030,770 | B1 | 10/2011 | Juskey |
| 8,164,171 | B2 | 4/2012 | Lin |
| 8,487,435 | B2 | 7/2013 | Juskey |
| 8,503,186 | B2 | 8/2013 | Lin |
| 8,653,647 | B2 | 2/2014 | Masuda |
| 8,664,044 | B2 | 3/2014 | Jin |
| 8,804,360 | B2 | 8/2014 | Lin |
| 8,860,207 | B2 | 10/2014 | Jin |
| 9,196,509 | B2 | 11/2015 | Scanlan |
| 9,355,945 | B1 | 5/2016 | Ge |
| 9,368,438 | B2 | 6/2016 | Lin |
| 9,385,074 | B2 | 7/2016 | Pendse |
| 9,391,041 | B2 | 7/2016 | Lin |
| 9,553,000 | B2 | 1/2017 | Yu |
| 9,601,463 | B2 | 3/2017 | Yu |
| 9,613,931 | B2 | 4/2017 | Lin |
| 9,685,390 | B2 | 6/2017 | Hu |
| 9,704,735 | B2 | 7/2017 | Konchady |
| 9,793,231 | B2 | 10/2017 | Chen |
| 9,831,170 | B2 | 11/2017 | Scanlan |
| 10,056,351 | B2 | 8/2018 | Yu |
| 10,229,892 | B2 | 3/2019 | Appelt |
| 10,325,879 | B2 | 6/2019 | Yu |
| 10,373,902 | B2 | 8/2019 | Scanlan |
| 10,490,468 | B2 | 11/2019 | Tsai |
| 10,510,721 | B2 | 12/2019 | Bhagavat |
| 10,593,620 | B2 | 3/2020 | Agarwal |
| 10,770,416 | B2 | 9/2020 | Kim |
| 10,879,224 | B2 | 12/2020 | Chen |
| 10,886,263 | B2 | 1/2021 | Chen |
| 11,024,605 | B2 | 6/2021 | Chen |
| 11,056,453 | B2 | 7/2021 | Olson |
| 11,171,076 | B2 | 11/2021 | Yu |
| 11,211,360 | B2 | 12/2021 | Huang |
| 11,276,656 | B2 | 3/2022 | Chen |
| 11,502,062 | B2 | 11/2022 | Chen |
| 2003/0122246 | A1 | 7/2003 | Lin |
| 2007/0278701 | A1 | 12/2007 | Chang |
| 2008/0038874 | A1 | 2/2008 | Lin |
| 2009/0212428 | A1 | 8/2009 | Yang |
| 2010/0290191 | A1 | 11/2010 | Lin |
| 2011/0156239 | A1 | 6/2011 | Jin |
| 2011/0202896 | A1 | 8/2011 | Scanlan |
| 2011/0210442 | A1 | 9/2011 | Lim |
| 2011/0285007 | A1 | 11/2011 | Chi |
| 2012/0038061 | A1 | 2/2012 | Su |
| 2012/0153493 | A1 | 6/2012 | Lee |
| 2012/0228754 | A1 | 9/2012 | Liu |
| 2013/0075894 | A1 | 3/2013 | Gallegos |
| 2013/0075924 | A1 | 3/2013 | Lin |
| 2013/0168830 | A1 | 7/2013 | Uehling |
| 2014/0102772 | A1 | 4/2014 | Chen |
| 2014/0124937 | A1 | 5/2014 | Wu |
| 2014/0335658 | A1 | 11/2014 | Scanlan |
| 2015/0249856 | A1 | 9/2015 | Pereira |
| 2015/0380386 | A1 | 12/2015 | Vincent |
| 2016/0005705 | A1 | 1/2016 | Masumoto |
| 2016/0064334 | A1 | 3/2016 | Bishop |
| 2016/0254229 | A1 | 9/2016 | Yu |
| 2017/0148755 | A1 | 5/2017 | Scanlan |
| 2017/0213797 | A1 | 7/2017 | Gulpen |
| 2018/0019221 | A1 | 1/2018 | Appelt |
| 2018/0082911 | A1 | 3/2018 | Bishop |
| 2018/0102311 | A1 | 4/2018 | Shih |
| 2018/0130761 | A1 | 5/2018 | Kim |
| 2018/0366423 | A1 | 12/2018 | Ong |
| 2019/0027450 | A1 | 1/2019 | Choi |
| 2019/0221520 | A1 | 7/2019 | Kim |
| 2019/0259718 | A1 | 8/2019 | Choi |
| 2019/0304938 | A1 | 10/2019 | Hadizadeh |
| 2019/0326257 | A1 | 10/2019 | Agarwal |
| 2019/0333893 | A1 | 10/2019 | Yu |
| 2019/0341351 | A1 | 11/2019 | May |
| 2020/0029435 | A1 | 1/2020 | Baek |
| 2020/0043853 | A1 | 2/2020 | Kim |
| 2020/0058627 | A1 | 2/2020 | Chen |
| 2020/0194330 | A1 | 6/2020 | Ramanathan |
| 2020/0219815 | A1 | 7/2020 | Elsherbini |
| 2020/0266184 | A1 | 8/2020 | Pietambaram |
| 2020/0273838 | A1 | 8/2020 | Williams |
| 2020/0294923 | A1 | 9/2020 | Bhagavat |
| 2020/0328161 | A1 | 10/2020 | Lin |
| 2020/0350272 | A1 | 11/2020 | Hong |
| 2020/0402941 | A1 | 12/2020 | Olson |
| 2020/0403299 | A1 | 12/2020 | Gupta |
| 2020/0409859 | A1 | 12/2020 | Saleh |
| 2020/0411397 | A1 | 12/2020 | Han |
| 2020/0411443 | A1 | 12/2020 | Guo |
| 2021/0066263 | A1 | 3/2021 | Chen |
| 2021/0366854 | A1 | 11/2021 | Yu |
| 2021/0366877 | A1 | 11/2021 | Wu |
| 2022/0005760 | A1 | 1/2022 | Dadvand |
| 2022/0262742 | A1* | 8/2022 | Hou .................. H01L 25/0655 |
| 2022/0352106 | A1 | 11/2022 | Sandstrom |
| 2023/0163112 | A1 | 5/2023 | We |
| 2023/0275047 | A1 | 8/2023 | Chen |
| 2023/0317581 | A1 | 10/2023 | Tang |
| 2024/0213135 | A1 | 6/2024 | Olson |

FOREIGN PATENT DOCUMENTS

| | | | |
|---|---|---|---|
| CN | 212136437 | U | 12/2020 |
| CN | 112234035 | A | 1/2021 |
| CN | 116544181 | | 8/2023 |
| CN | 117438319 | | 1/2024 |
| JP | 2018032750 | | 3/2018 |
| KR | 20150009668 | | 1/2015 |
| KR | 1020150009668 | | 1/2015 |
| KR | 1020160123959 | | 10/2016 |
| KR | 20170094207 | | 8/2017 |
| KR | 20180084877 | | 7/2018 |
| KR | 20210134983 | | 11/2021 |
| KR | 20210148855 | | 12/2021 |
| KR | 20230037608 | | 3/2023 |
| TW | I261901 | B | 9/2006 |
| TW | 201413845 | | 4/2014 |
| TW | 201712822 | | 4/2017 |
| TW | 202205600 | A | 2/2022 |
| TW | 202234636 | A | 9/2022 |
| TW | 202315014 | A | 4/2023 |
| TW | 202401664 | | 1/2024 |
| WO | 2020263952 | | 12/2020 |

OTHER PUBLICATIONS

B0ettcher, Lars et al. Next Generation System in a Package Manufacturing by Embedded Chip Technologies. Additional Conferences (Device Packaging, HiTEC, HiTEN, & CICMT). 2010.

Boettcher, Lars et al. "Embedding of Chips for System in Package Realization—Technology and Applications." 2008. pp. 383-386.

Braun, Tanja et al. "Fan-Out Wafer and Panel Level Packaging as Packaging Platform for Heterogeneous Integration." Micromachines. 2019. vol. 10, pp. 342.

Jin, Yonggang et al. "Development and Characterization of Next Generation EWLB Embedded Wafer Level BGA) Packaging." ETC, 2012. pp. 1388-1393.

Jin, Yonggang et al. "Enhanced Fan-Out WLP for High Power Device Packaging." International Electronics Manufacturing Technology Conference (IEMT), 2012.

(56)         References Cited

OTHER PUBLICATIONS

Kurita, Yoichiro et al. "Fan-Out WLP With Highly Flexible Design Capabilities." 3rd Electronic System-Integration Technology Conference (ESTC), Sep. 13-16, 2010.

Ma, Yiyi et al. "Thermal Cycling Reliability Assessment and Enhancement of Embedded Wafer Level LGA Packages for Power Applications." Electronic Packaging Technology Conference (EPTC), 2012. pp. 606-611.

Motohasi, N., et al. System in Wafer Level Package Technology with RDL first process, 2011 Electronic Components and Technology Conferencepp 59-64.

Stahr, Hannes et al. "Embedded Components on the Way to Industrialisation." 2011. https://ats.het/wp-content/uploads/2017/03/SMTA_Austin_TX_2011_ECP_Paper.pdf.

* cited by examiner

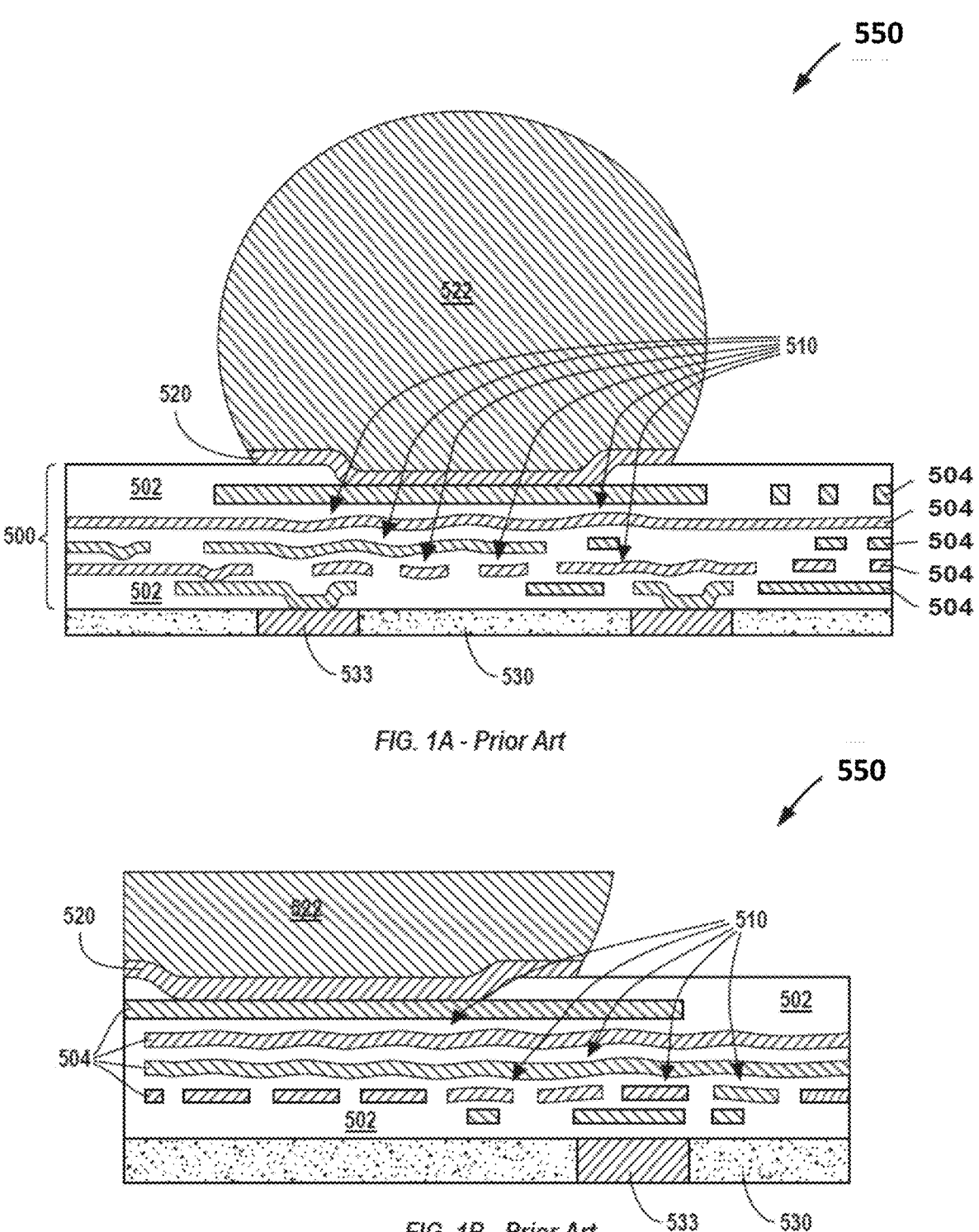
FIG. 1A - Prior Art
FIG. 1B - Prior Art

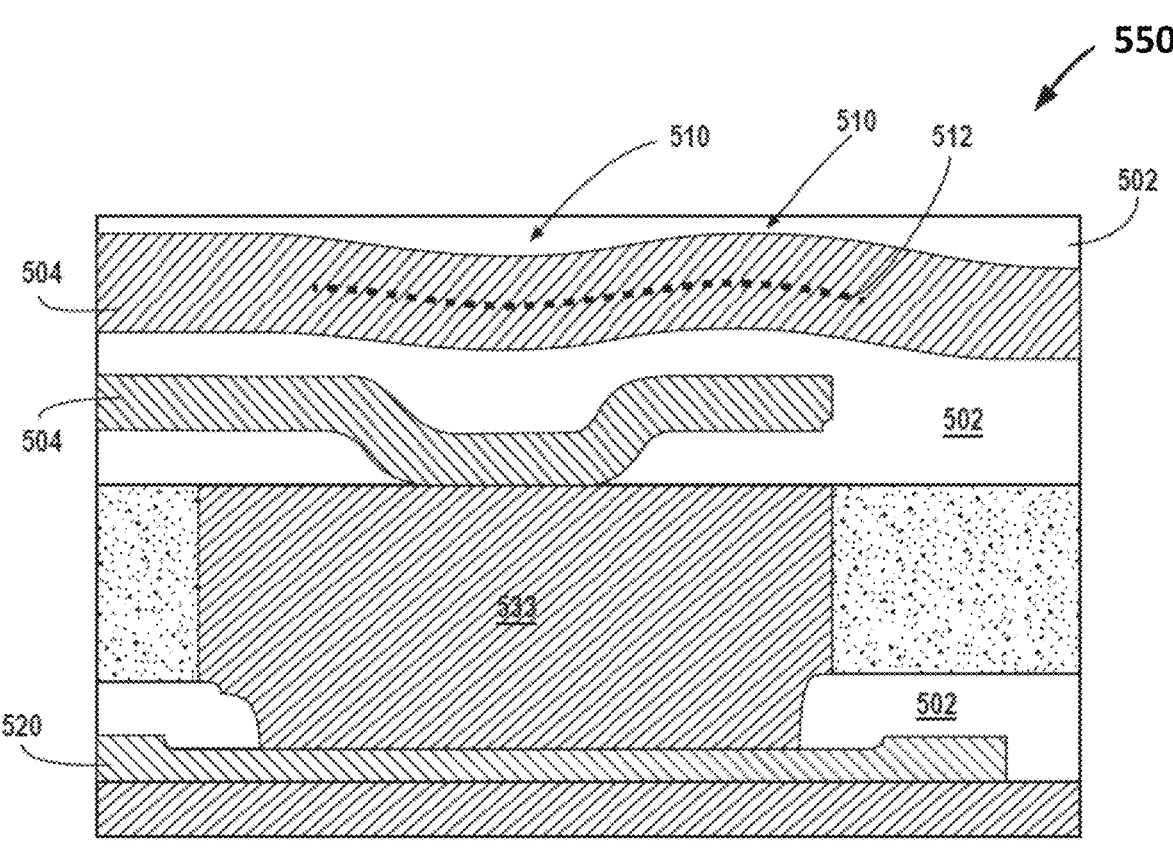
*FIG. 1C - Prior Art*
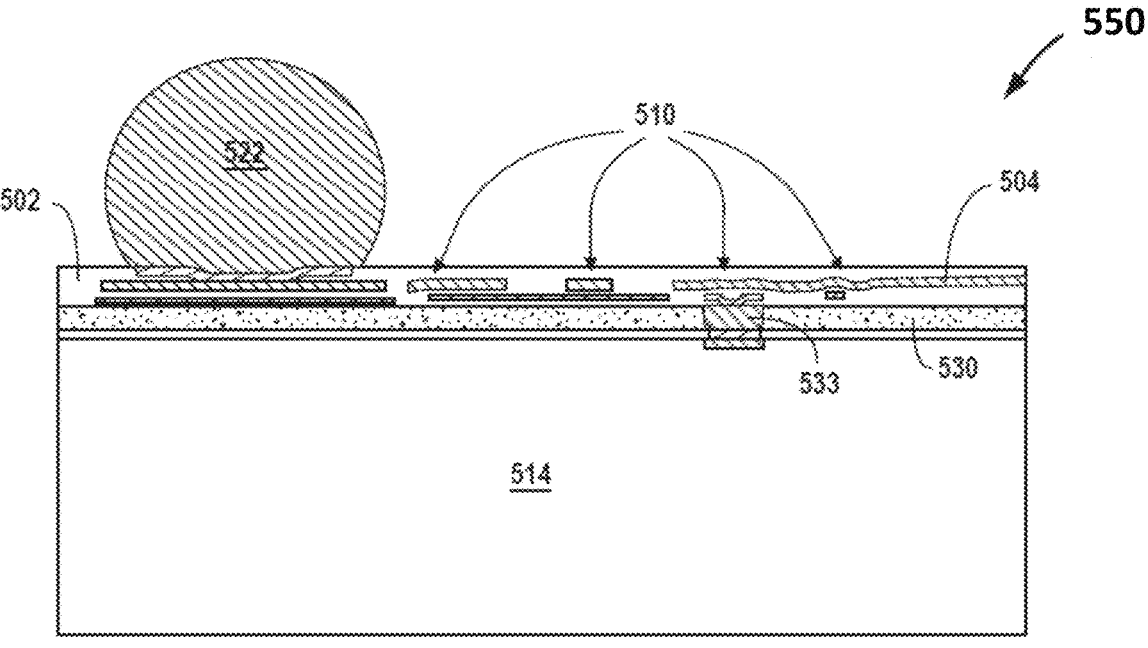
*FIG. 1D - Prior Art*

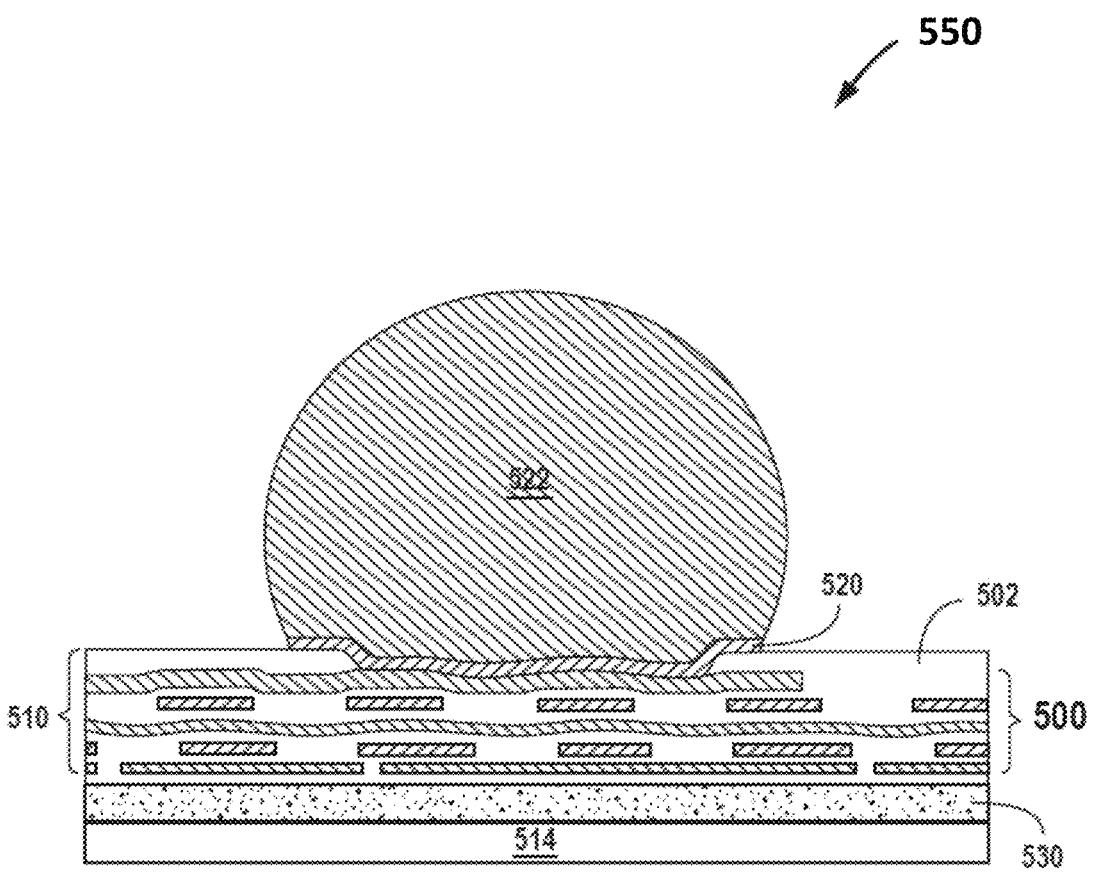
*FIG. 1E - Prior Art*

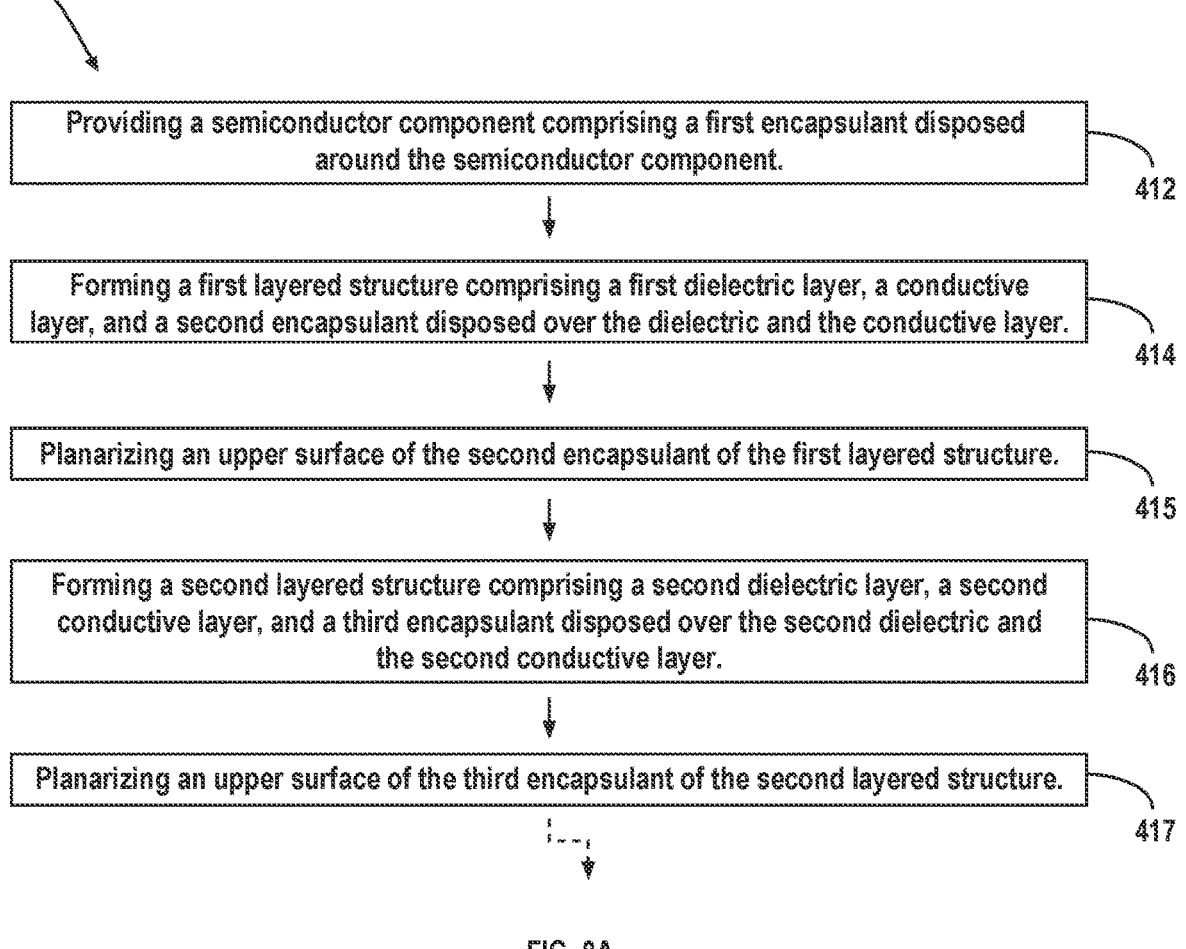

400

Providing a semiconductor component comprising a first encapsulant disposed around the semiconductor component.

412

Forming a first layered structure comprising a first dielectric layer, a conductive layer, and a second encapsulant disposed over the dielectric and the conductive layer.

414

Planarizing an upper surface of the second encapsulant of the first layered structure.

415

Forming a second layered structure comprising a second dielectric layer, a second conductive layer, and a third encapsulant disposed over the second dielectric and the second conductive layer.

416

Planarizing an upper surface of the third encapsulant of the second layered structure.

Forming a multi-layer encapsulant body as part of one or more of the layered structures.

420

Forming the second encapsulant and the third encapsulant without semiconductor chips disposed therein.

422

LAYERED MOLDED DIRECT CONTACT AND DIELECTRIC STRUCTURE AND METHOD FOR MAKING THE SAME

CROSS-REFERENCE TO RELATED APPLICATIONS

This application claims the benefit of U.S. Provisional Patent No. 63/480,094, entitled "Stacked Molded Direct Contact and Dielectric Structure and Method for Making the Same," filed on Jan. 16, 2023, the entire disclosure of which is hereby incorporated herein by this reference.

INCORPORATION-BY-REFERENCE

Incorporated by reference in their entirety herein are the disclosures of U.S. Provisional Patent No. 63/347,516, entitled "Molded Direct Contact Interconnect Build-Up Structure Without Capture Pads," filed on May 31, 2022, U.S. Provisional Patent No. 63,391,694, entitled "Molded Direct Contact Interconnect Substrate," filed on Jul. 22, 2022, and U.S. Utility Ser. No. 17/957,683, entitled "Quad Flat No-Lead (QFN) Package Without Leadframe and Direct Contact Interconnect Build-Up Structure and Method for Making the Same," filed on Sep. 30, 2022.

TECHNICAL FIELD

Embodiments of the present disclosure relate to the field of devices and methods of forming an electronic assembly or semiconductor assembly, comprising stacked molded direct contact and dielectric structures, such as for build-up interconnect structures and methods for making the same.

BACKGROUND

Semiconductor devices, packages, substrates, and interposers are commonly found in modern electronic products. Production of semiconductor devices involves a multistep build-up of components. Conventional interconnect structures alternate dielectric and conductive layers. An opening or via hole may be created in the dielectric to allow connectivity from one layer to another. On the conductive layers, capture pads are used for the vias to correct for inconsistencies in manufacture.

FIGS. 1A-1E illustrate cross-sectional side views of assemblies or packages 550 that provide various examples from the prior art where deformations 510, including dips, waves, or undulations result in conventional build-up interconnect structures 500, from following the contours from lower layers, including dielectric layers 502 and conductive layers 504. The deformations 510 can make manufacturing more difficult and often increase manufacturing cost. The features of a chip or component 514, a UBM pad, POP land pads, SMD land pads, or LGA pads 520, package interconnects, solder bumps, electrodes, LGA array or BGA array 522, encapsulant 530 and vertical conductive interconnects 533 are also illustrated.

More specifically, FIG. 1C illustrates an enlarged view in which the conductive layer 504 comprises deformations 510 that are emphasized with the trajectory or centerline of 512 of the deformity 510. The deformations 510 are shown as dips, waves, or undulations.

SUMMARY

In some aspects, the disclosure concerns a method of making a semiconductor assembly, comprising providing a semiconductor component comprising conductive studs formed over and coupled to a frontside of the semiconductor component. A first encapsulant is disposed around and contacts at least four side surfaces of the semiconductor component, is disposed over the frontside of the semiconductor component, and is disposed so as to contact at least a portion of a side surface of the conductive studs. A first layered structure is formed as a build-up interconnect structure over the encapsulant and over the semiconductor component. Forming the first layered structure comprises forming a first conductive layer comprising a redistribution layer (RDL) disposed over the first encapsulant and coupled with the conductive studs, forming a first dielectric layer over the first conductive layer, forming conductive stumps coupled to the first conductive layer and exposed with respect to the first dielectric layer, disposing a second encapsulant over the first conductive layer, over the first dielectric layer, and over the conductive stumps, and planarizing an upper surface of the second encapsulant to expose the conductive stumps and to create a flat upper surface on which to form additional structures. A second layered structure is formed as a build-up interconnect structure over the first layered structure and on the flat upper surface to improve a flatness of the second layered structure. Forming the second layered structure comprises forming a second conductive layer over the first layered structure, forming a second dielectric layer disposed over the second conductive layer, and forming a third encapsulant comprising a planarized upper surface disposed over the second conductive layer and over the second dielectric layer. A portion of the second encapsulant forms a multi-layer encapsulant body that passes through or around one or more of: at least a portion of the first conductive layer and the first dielectric layer to directly contact the first encapsulant, and at least a portion of the second conductive layer and the second dielectric layer to directly contact the third encapsulant. The second encapsulant and the third encapsulant are formed without semiconductor chips disposed therein.

In some instances, the interstitial dielectric layer is disposed between the first encapsulant and the first conductive layer. One or more of the first dielectric layer, the second dielectric layer, and the interstitial dielectric layer comprise polyimide. The first conductive layer is formed directly on the first encapsulant without an interstitial dielectric layer. Package interconnects are formed over the second layered structure and over the planarized upper surface, wherein the package interconnects comprise one or more of solder bumps, pins, a land grid array (LGA), or a ball grid array (BGA). One or more additional conductive layers are formed over the first dielectric layer, over the second dielectric layer, or over both the first dielectric layer and over the second dielectric layer, and one or more of the second encapsulant and the third encapsulant are formed over, and directly contacting, the one or more additional conductive layers. A portion of the second encapsulant may form a multi-layer encapsulant body that passes through or around one or more of at least a portion of the first conductive layer and the first dielectric layer to directly contact the first encapsulant, and at least a portion of the second conductive layer and the second dielectric layer to directly contact the third encapsulant. The first dielectric layer may be formed such that a portion of the first dielectric layer is in contact with a lower portion of a sidewall of the conductive stumps; and the second layer of encapsulant is disposed such that a portion of the second layer of encapsulant is in contact with an upper portion of the sidewall of the conductive stumps.

A backside layered structure may be formed over a backside of the semiconductor component.

In other aspects, the disclosure concerns a method of making a semiconductor assembly, comprising providing a semiconductor component disposed within a first encapsulant, the encapsulant disposed around and contacting at least four side surfaces of the semiconductor component and disposed over a frontside of the semiconductor component. A first layered structure may be formed as a build-up interconnect structure over the encapsulant and over the semiconductor component. The first layered structure may be formed by forming a first conductive layer comprising a RDL disposed over the first encapsulant and coupled with the semiconductor component, forming a first dielectric over the first conductive layer, forming conductive stumps coupled to the first conductive layer, disposing a second encapsulant over the first conductive layer, over the first dielectric, and over the conductive stumps, and planarizing an upper surface of the second encapsulant to expose the conductive stumps and to create a flat upper surface on which to form additional structures. A second layered structure may be formed as a build-up interconnect structure over the first layered structure and on the flat upper surface, wherein forming the second layered structure comprises forming a second conductive layer over the first layered structure, forming a second dielectric disposed over the second conductive layer, and forming a third encapsulant comprising a planarized upper surface disposed over the second conductive layer and over the second dielectric.

In some instances, a portion of the second encapsulant forms a multi-layer encapsulant body that passes through or around one or more of at least a portion of the first conductive layer and the first dielectric to directly contact the first encapsulant and at least a portion of the second conductive layer and the second dielectric to directly contact the third encapsulant. The semiconductor component may comprise a chip comprising conductive studs formed over and coupled to the frontside of the semiconductor component, and the encapsulant may contact a side surface of the conductive studs. An interstitial dielectric may be disposed between the first encapsulant and the first conductive layer. The first conductive layer may be formed directly on the first encapsulant without an interstitial dielectric. The first layered structure and the second layered structure may each comprise a RDL. One or more additional conductive layers may be disposed over the first dielectric layer, over the second dielectric layer, or over both the first dielectric layer and over the second dielectric layer, and one or more of the second encapsulant and the third encapsulant may be disposed over, and directly contact, the one or more additional conductive layers. The second encapsulant and the third encapsulant may be formed without semiconductor chips disposed therein. The first dielectric may be disposed such that a portion of the first dielectric is in contact with a lower portion of a sidewall of the conductive stumps. The second layer of encapsulant may be disposed such that a portion of the second layer of encapsulant is in contact with an upper portion of the sidewall of the conductive stumps. A backside layered structure may be formed over a backside of the semiconductor component. A lower surface of the second encapsulant may be formed comprising an undulating contour that follows a deformation of the first conductive layer, and the flat upper surface of the second encapsulant may be formed such that it does not comprise an undulating contour and does not follow the deformation of the first conductive layer.

In yet other aspects, the disclosure concerns a method of making a semiconductor assembly, comprising providing a semiconductor component disposed within a first encapsulant, the encapsulant disposed around and contacting at least four side surfaces of the semiconductor component and disposed over a frontside of the semiconductor component. A first layered structure may be formed as a build-up interconnect structure over the encapsulant and over the semiconductor component. The first layered structure may comprise a first conductive layer formed over the first encapsulant, a first dielectric formed over the first conductive layer, a second encapsulant disposed over the first conductive layer and over the first dielectric, and a planarized upper surface of the second encapsulant that creates a flat surface on which to form additional structures.

In some instances, an interstitial dielectric may be disposed between the first encapsulant and the first conductive layer. The first conductive layer may be formed directly on the first encapsulant without an interstitial dielectric. A second layered structure may be formed as a build-up interconnect structure over the first layered structure and on the flat surface to improve a flatness of the second layered structure. The first layered structure and the second layered structure may each comprise a RDL. Package interconnects may be formed over the first layered structure and over the flat surface. The package interconnects comprise one or more of solder bumps, pins, a LGA, or a BGA. The second layered structure may comprise a second conductive layer disposed over the first layered structure, a second dielectric disposed over the second conductive layer, and either a third encapsulant comprising a planarized upper surface disposed over the second conductive layer and over the second dielectric, or a third dielectric comprising vias disposed over the second conductive layer and over the second dielectric such that the second layered structure does not comprise encapsulant. A second conductive layer may be formed over the first dielectric, and the second encapsulant layer may be formed over, and directly contact the second conductive layer. The second encapsulant and the third encapsulant may be formed without semiconductor chips disposed therein. A portion of the second encapsulant may form a multi-layer encapsulant body that passes through or around one or more of at least a portion of the first conductive layer and the first dielectric to directly contact the first encapsulant, and at least a portion of the second conductive layer and the second dielectric to directly contact the third encapsulant. A conductive stump may be formed coupled to the first conductive layer, the first dielectric formed such that a portion of the first dielectric is in contact with a lower portion of a sidewall of the conductive stump, and the second layer of encapsulant disposed such that a portion of the second layer of encapsulant is in contact with an upper portion of the sidewall of the conductive stump.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of.," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

BRIEF DESCRIPTION OF THE DRAWINGS

FIGS. 1A-1E illustrate various assemblies, such as semiconductor packages, comprising build-up interconnect structures, as known in the prior art.

FIGS. 8A and 8B illustrate flow charts or wireframes for a method of forming a semiconductor assembly comprising layered structures.

DETAILED DESCRIPTION

Figure 2A:
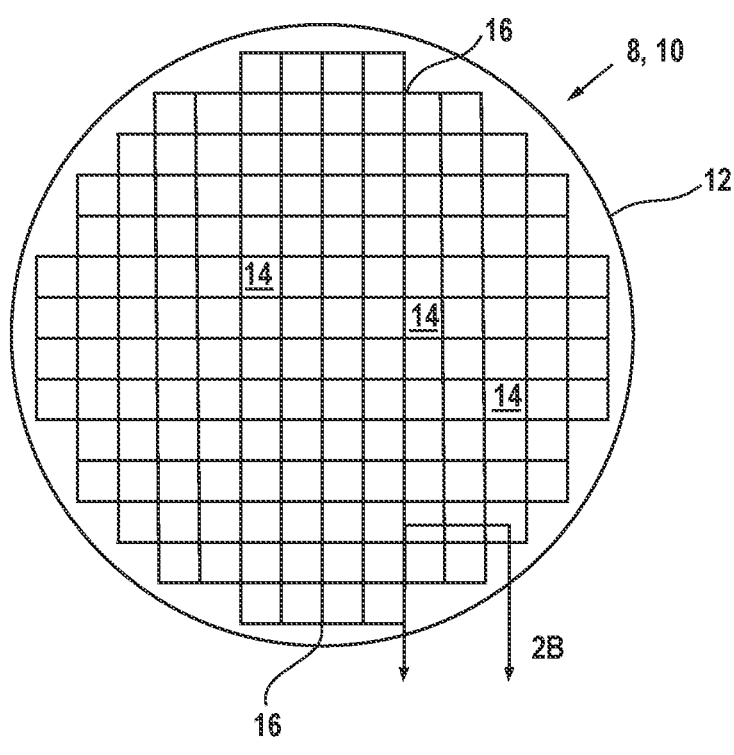
FIGS. 2A-2D illustrate components, such as semiconductor die, chips, and embedded devices.

This disclosure relates to molded direct contact and dielectric interconnect structures, such as for use with semiconductor structures, devices, and packages. The molded direct contact and dielectric interconnect structures may be (or comprise conductive layers) that are formed as part of an additive or build-up process. Additionally, the interconnect structures may be (or comprise conductive layers) that are etched back and formed as part of an etching or reductive process, in which a conductive layer is deposited (sometimes including the via to the conductive layer below, sometimes using a separate deposited via 'plug' between layers), after which a photoresist is applied and patterned over the conductive layer, and after which an etching process (either wet etching, or dry etching) is used to remove unwanted conductive material—resulting in the desired conductive pattern and the desired layered structures. When desired, the process used to form the conductive layer may be detected structurally because etched-back conductors comprise more sloped sidewalls (due to the typically somewhat isotropic etching) with respect to the built-up conductors. In any case we should make sure we are allowing for either built-up or etched-back conductive layers. For convenience and uniformity, the term "build-up" is used throughout the application, however a person of ordinary skill in the art (POSA) will appreciate that for the purposes of this disclosure, etched back interconnect structures are also included.

In some instances, the molded direct contact and dielectric interconnect build-up structures may comprise routing for semiconductor devices comprising different pitches, such as high density and ultra-high density as described more fully herein. The molded direct contact and dielectric interconnect build-up structures (and method for making and using the same) may comprise, or provide a unique layered structure that includes a dielectric with patterned via holes and one or more conductive routing layers, followed by a non-photo defined molded or encapsulant structure which allows the structure to be planarized (by molding or grinding) and provide a flat or planar surface for subsequent dielectric and one or more routing layers in a repeating process. The dielectric may be a photo-definable material with photo-patterning used to define via holes or the dielectric may be non-photo-definable and via holes are created using a photoresist pattern followed by a wet or dry etching process. The dielectric material will have different properties from the encapsulant material, and in some cases a low dielectric constant or other properties that allow the dielectric to improve the electrical performance of the interconnect structure, conducive layer, or both, as measured with respect to what could be achieved using only the encapsulant. In some cases the different properties of the dielectric material will allow improved thermal performance or improved reliability performance as compared to what could be achieved using only the encapsulant.

Conventionally, build-up layers were limited to 4-6 layers in wafer level or panel level build-up fabrication processes. However, with the current molded direct contact and dielectric interconnect build-up structures, any number of desired layers, even for example, 20-30 build-up layers are now possible for wafer level or panel level build-up fabrication processes.

As such, advantages of the molded direct contact and dielectric interconnect build-up structures include one or more of: (i) planar encapsulant or mold compound interleaved or interspersed (vertically offset) from dielectric layers within layered structures, (ii) improved electrical performance and signal performance for conductive layers (e.g. signal or clock lines) formed on, below, within, or simultaneously on, below and within, dielectric material (such as polyimide (PI)) within a larger structure comprising encapsulant layers, (iii) an increased number of vertical build-up layers, (iv) improved thermal performance, and (v) improved reliability performance.

At least some of the above advantages are available at least in part by using unit specific patterning (such as patterning (custom lithography) and build-up interconnect structures such as a frontside build-up interconnect structure, which is also known under the trademark "Adaptive Patterning™"). Unit specific patterning allows for scaling to ultra-high-density pitch, which may often be used for higher speed chip attach equipment for semiconductor die. Unit specific patterning (including Adaptive Patterning™ and AP™) will ensure alignment for high density interconnects with the molded direct contact and dielectric interconnect build-up structures. Unit Specific Patterning may also be used in the processes disclosed herein for manufacturing packages including the ability to make large area connections which are precisely aligned to chip bond pads for very low contact resistance.

The current structures and method provide advantages with respect to the prior art, wherein the prior art comprises using dielectric materials such as polymers and polyimide without mold compound. By adding layers of encapsulant or mold compound, topography planarity is achieved, and flatness is improved.

Detailed aspects and applications of the disclosure are described below in the following drawings and detailed description of the technology. Unless specifically noted, it is intended that the words and phrases in the specification and the claims be given their plain, ordinary, and accustomed meaning to those of ordinary skill in the applicable arts.

In the following description, and for the purposes of explanation, numerous specific details are set forth in order to provide a thorough understanding of the various aspects of the disclosure. It will be understood, however, by those skilled in the relevant arts, that embodiments of the technology disclosed herein may be practiced without these specific details. It should be noted that there are many different and alternative configurations, devices and technologies to which the disclosed technologies may be applied. The full scope of the technology disclosed herein is not limited to the examples that are described below.

The singular forms "a," "an," and "the" include plural referents unless the context clearly dictates otherwise. Thus, for example, reference to "a step" includes reference to one or more of such steps.

This disclosure, its aspects and implementations, are not limited to the specific package types, material types, or other system component examples, or methods disclosed herein. Many additional components, manufacturing and assembly procedures known in the art consistent with semiconductor wafer fabrication, manufacture and packaging are contemplated for use with particular implementations from this disclosure. Accordingly, for example, although particular implementations are disclosed, such implementations and implementing components may comprise any components, models, types, materials, versions, quantities, or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented but have been omitted for purposes of brevity. As used herein, "substantially" or "about" means the stated amount plus or minus (+ or −) 50% or less, 40% or less, 30% or less, 20% or less, 10% or less, 5% or less, or 1% or less.

Where the following examples, embodiments and implementations reference examples, it should be understood by those of ordinary skill in the art that other manufacturing devices and examples could be intermixed or substituted with those provided. In places where the description refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

FIG. 2A illustrates a plan or top view of a substrate 8, which may comprise a semiconductor wafer or native wafer 10 with a base substrate material 12, such as, without limitation, silicon, germanium, gallium arsenide, indium phosphide, gallium nitride, or silicon carbide, for structural support. A plurality of chips, semiconductor die, or components 14 can be formed on wafer 10 separated by a non-active, inter-die wafer area or saw street 16. As used herein, the component 14 comprises active devices, passive devices, or both. Components 14 comprise semiconductor components, chips, and semiconductor die. Components 14 further comprise non-semiconductor components such as components that are non-active, passive or are formed without transistors. Components 14 comprise sensors and Microelectromechanical systems (MEMS) that do not rely on a semiconductor material for making transistors. Components 14 also comprise discrete passives such as resistors or capacitors, or groups of passives (such as an Integrated Passive Device (IPD)), other semiconductor die, ICs, bridge die, wafer level chip scale packages (WLCSPs), MEMs, optical components including image sensors, transmitters, receivers and light emitting diodes (LEDs), and any other suitable component. For purposes of illustration, a non-limiting example of component 14 being a chip or semiconductor die is described in FIGS. 2A-2D. Accordingly, the saw street 16 can provide cutting areas to singulate the semiconductor wafer 10 into the individual components or chips 14 that become embedded devices, which can be formed on a substrate 8 formed of glass, ceramic, or other suitable material for providing structural support for subsequent processing.

Each component 14 may comprise one or more active devices, passive devices, or both active devices and passive devices. In some instances, the component 14 may be formed without active and passive devices, and be used for transmission or routing, such as by comprising TSVs for vertical interconnect. For example, the component 14 may be formed as a bridge chip with only electrical routing and with copper studs of the semiconductor chip electrically connected or coupled with wiring, routing, or RDL. The component 14 may also be only a dummy substrate with no electrical function, but rather act as structural element and may or may not include copper studs.

The component 14 may comprise semiconductor chips and semiconductor die that comprise a backside or back surface 18 and a frontside or front surface comprising an active layer 20 opposite the backside 18. The active layer contains one or more analog, or digital circuits implemented as active devices, conductive layers, and dielectric layers formed within or on the chip and electrically interconnected according to the electrical design and function of the semiconductor chip. In some instances, passive devices may also be integrated as part of the semiconductor chip or semiconductor die. The component 14 may comprise circuits that may include one or more transistors, diodes, and other circuit elements formed within the active layer to implement analog circuits or digital circuits, such as DSP, ASIC, memory, or other circuits. Circuits may include RF circuits, LED, LCOS, CIS, transistor, optoelectronic, MEMS and the like. The component 14 may also contain IPDs such as inductors, capacitors, and resistors, for RF signal processing, digital power line control or other functions. The component 14 may be formed on a native wafer 10. In some instances, a wafer level process may be used to produce many packages simultaneously on the wafer 10. In other instances, the package may be formed as part of a reconstituted wafer and may comprise multiple components or chips molded together.

Figure 2B:
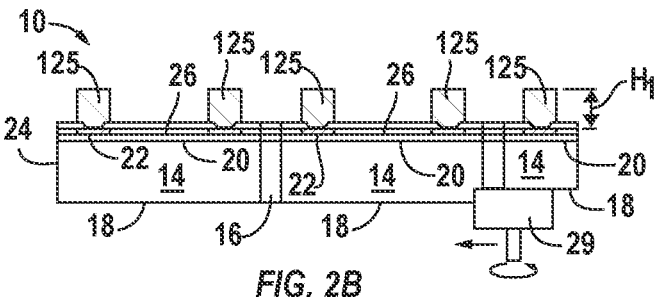

FIG. 2B illustrates a cross-sectional view of a portion of semiconductor wafer 10 shown taken along the section line 2B in FIG. 2A. Each component 14 is shown comprising a backside or back surface 18 and an active layer 20 opposite the backside.

An electrically conductive layer or contact pads 22 is formed over active layer 20 using PVD, CVD, electrolytic plating, electroless plating process, or other suitable metal deposition process. Conductive layer 22 can be one or more layers of aluminum (Al), Titanium (Ti), copper (Cu), tin (Sn), nickel (Ni), gold (Au), palladium (Pd), silver (Ag), cobalt (Co), platinum (Pt), tantalum (Ta), or other suitable electrically conductive material. Conductive layer 22 operates as contact pads or bond pads electrically coupled or connected to the circuits on active layer 20. Conductive layer 22 can be formed as contact pads disposed side-by-side a first distance from an edge 24 of component 14, as shown in FIG. 2B. Alternatively, conductive layer 22 can be formed as contact pads that are offset in multiple rows such that a first row of contact pads is disposed a first distance from the edge 24 of the component 14, and a second row of contact pads alternating with the first row is disposed a second distance from the edge 24 of the component 14. In other instances, the component 14 can comprise digital chips, analog chips, or RF chips (or other chips) with more than two rows of bond pads and may further comprise bond pads 22 over the whole surface of the chip that do not follow a full grid pattern. Other components 14 may have bond pads in an array over the whole surface of the chip.

FIG. 2B also illustrates the semiconductor substrate 10 and components 14 can undergo an optional operation, such as grinding with a grinder 29, wet etching, plasma etching, polishing or other suitable process, to reduce a thickness of the semiconductor substrate 10 and component 14.

FIG. 2B further shows one or more optional insulating, passivating, or dielectric layers 26 may be conformally applied over active layer 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), Carbon-Doped silicon Oxide (CDO), tantalum pentoxide ($Ta_2O_5$), aluminum oxide ($Al_2O_3$), polymer, polyimide, benzocyclobutene (BCB), polybenzoxazoles (PBO), or other material having suitable insulating and structural properties. Although the previous list includes some precise chemical formulas for some materials, in some cases depending on the deposition process the insulating material may be non-stoichiometric. Alternatively, components 14 are packaged without the use of insulating layer 26. In another embodiment, insulating layer 26 includes a passivation layer formed over active layer 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 2B shows conductive studs or electrical interconnect structures 125 can be formed as bumps, thick pads, columns, pillars, posts, or conductive studs and are disposed over, and coupled or connected to, contact pads 22. The conductive studs 125 can be formed directly on contact pads 22 using patterning and metal deposition processes such as printing, PVD, CVD, sputtering, electrolytic plating, electroless plating, evaporation, or other suitable metal deposition process. Alternately, conductive studs 125 may be formed in a position not vertically over the pads 22 and connected by RDL. Conductive studs 125 can be one or more layers of Al, Cu, Sn, Ni, Au, Ag, palladium (Pd), or other suitable electrically conductive material and can include one or more Under-Bump Metallization (UBM) layers. In an embodiment, a photoresist layer can be deposited over component 14 and contact pads 22. A portion of the photoresist layer can be exposed and removed by a developing or other suitable process. Electrically conductive studs 125 can then be formed as pillars or other structures as previously described in the removed portion of the photoresist and over contact pads 22 using a plating process. In some embodiments, copper may be used in a plating process. The photoresist layer and other appropriate layers, such as a seed layer deposited prior to depositing the photoresist, can be removed leaving conductive studs 125 that provide for subsequent mechanical and electrical interconnection and a standoff with respect to active layer 20 and insulating layer 26 if present. In some instances, the conductive studs 125 include a height $H_1$ in a range of 10-100 micrometers (μm), 5-50 μm, or about 25 μm.

A conductive stud is a conductive interconnect structure that may have generally vertical sides and may be wider than it is tall, built-up on a substrate, such as over an active surface of a chip, polyimide, or mold compound. A conductive stud, though typically formed of the same materials as a pillar or post would be formed, may differ from a pillar or post, each of which may have a height greater than its width. A conductive stud, though it is commonly formed in a cylindrical shape, may be formed with a cross-sectional area that is circular, oval, octagonal, or as any polygonal or other shape and size. Another use for a conductive stud is as a thermally conductive stud that is not electrically coupled to an active electrical circuit but is instead thermally coupled to a heat source of an active device to conduct or dissipate the heat to another structure, such as to a land pad on a surface of a PCB (i.e., it is a dummy conductive stud). The generally vertical and straight sides of a conductive stud 125 are different from the sides shape that exists for a solder ball or a compressed or outwardly deformed solder ball that has generally rounded sides. The generally vertical nature of a conductive stud 125 comes from being formed in a structure that has been previously developed or etched, such as within openings in a photoresist layer, which will also be generally vertical and straight-walled, although it may comprise imperfections or irregularities in shape that result from the developing or etching process, the photoresist material, or other materials and processes used. For example, developing or etching does not generally perfectly or uniformly remove the photoresist within the openings, and therefore forms imperfect, generally vertical openings for deposition of conductive materials for the conductive stud 125. The term "generally vertical" as used herein includes perfectly vertical and imperfectly vertical sides. A conductive stud is not a wire bond and is not solder.

Figure 2C:
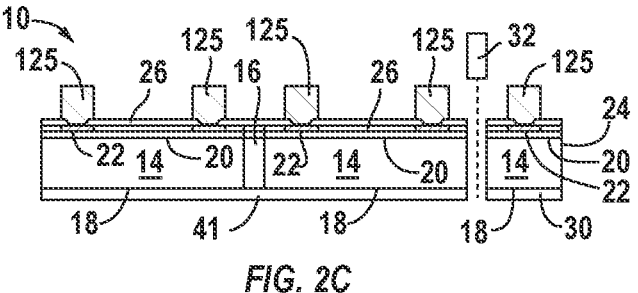

FIG. 2C further illustrates an instance in which one or more of an optional adhesive or a die attach film (DAF) 41—which in some instance may even be a conductive material for thermal transfer or other suitable purpose—may be attached to the back surface 18 of the component 14, such as for subsequent mounting on a carrier. FIG. 2C also illustrates wafer 10 can be singulated with a saw or wafer cutting tool 32 into individual components 14 through saw streets 16 using a saw blade, laser cutting tool, plasma, or a scribe and break process. In some instances, the components 14 will have a thickness (shown in the vertical direction, bottom to top, of the page) of between about 15 μm to about 150 μm for thin ground wafers, or about 100 μm to about 800 μm for thick ground wafers.

Figure 2D:
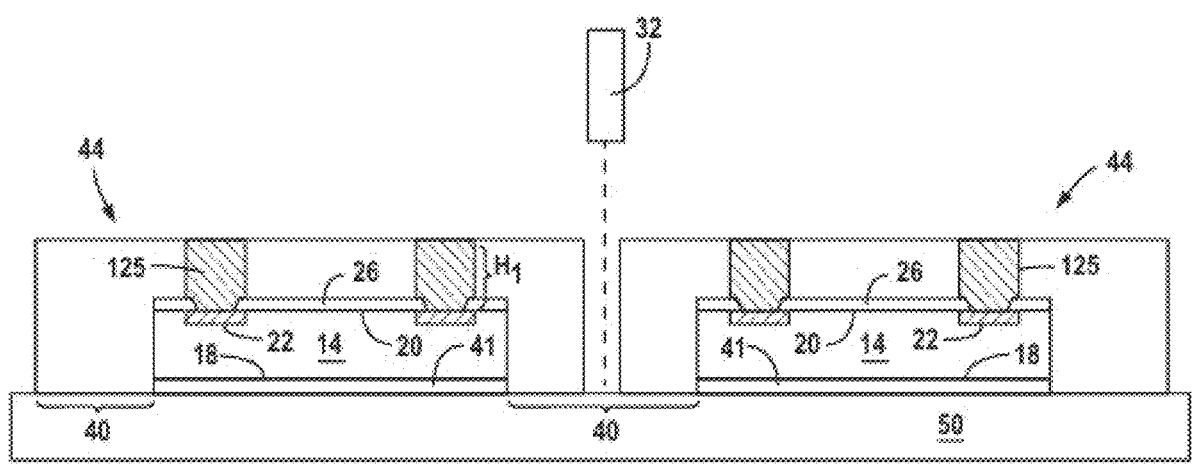

FIG. 2D, illustrates a cross-sectional view of an instance in which the components 14 are formed as embedded components or embedded semiconductor devices 44. The embedded components 44 can be disposed over a temporary carrier, a reusable carrier, a sacrificial carrier, a permanent carrier, or any suitable carrier 50, made of metal, glass, silicon, mold compound, or other suitable material, which may include a release layer. The carrier 50 may comprise a form factor or footprint of a wafer (circular footprint), a panel (square or rectangle), or of any suitable shape and may comprise a diameter or width of 200-600 mm, such as 300 mm, or of any other suitable size. The embedded components 44 can be separated by being singulated through gaps or saw streets 40 using a saw blade, grinding wheel, plasma cutting tool, laser cutting or other suitable tool 32 into individual embedded components or embedded semiconductor devices 44 which may be interchangeably used with components 14 in any of the subsequent FIGs. and explanations. The embedded components 44 can then be used as part of a subsequently formed assembly or package as discussed in greater detail below. However, the embedded component 44 comprising a chip or semiconductor die or other component 14 can also be fully testable after conductive studs 125 are applied and before the embedded components 44 are singulated from a panel or assembled into another structure.

In some instances, the embedded semiconductor die 44 can be formed as described in U.S. patent application Ser. No. 13/632,062, now U.S. Pat. No. 8,535,978, entitled "Die Up Fully Molded Fan-out Wafer Level Packaging," which was filed on Apr. 29, 2015, the entirety of the disclosure of which is incorporated herein by this reference.

Figure 3A:
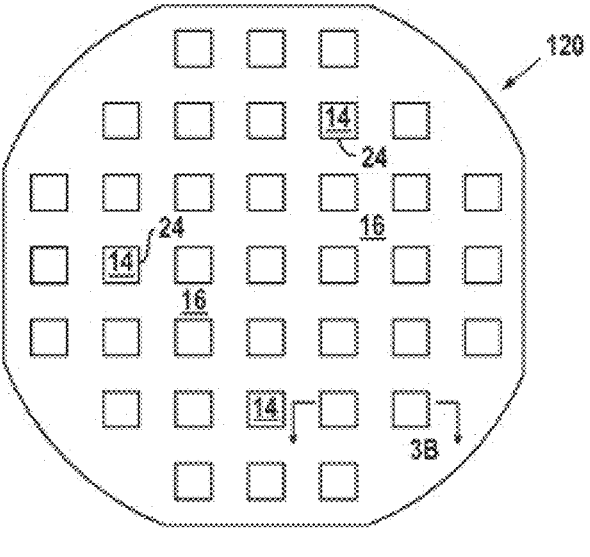
FIGS. 3A-3F illustrate the formation of a reconstituted wafer or panel, comprising components disposed within an encapsulant.

FIG. 3A illustrates a plan or top view of the temporary carrier 120, which may comprise a form factor or footprint of a wafer (circular or substantially circular footprint), a panel (square or rectangle), or of any suitable shape (such as generally circular with flat edges), and may comprise a diameter or width of 200-600 mm, such as 300 mm, or of any other suitable size. Components 14 may be disposed over temporary carrier 120 using a pick and place operation, or in any other suitable way.

The orientation of components 14, can be either face up with active layer 20 oriented away from carrier 120 to which the components 14 are mounted, or alternatively can be mounted face down with active layer 20 oriented toward the carrier 120 to which the components 14 are mounted. Accordingly, an adhesive 41 can be included or omitted from over back surface 18 of components 14, depending on the process used for encapsulating the components 14 and forming a panel or reconstituted panel 134 (as shown, e.g., in FIG. 3E) comprising components 14 fully molded within encapsulant 130 (as shown, e.g., in FIG. 3D).

Figure 3B:
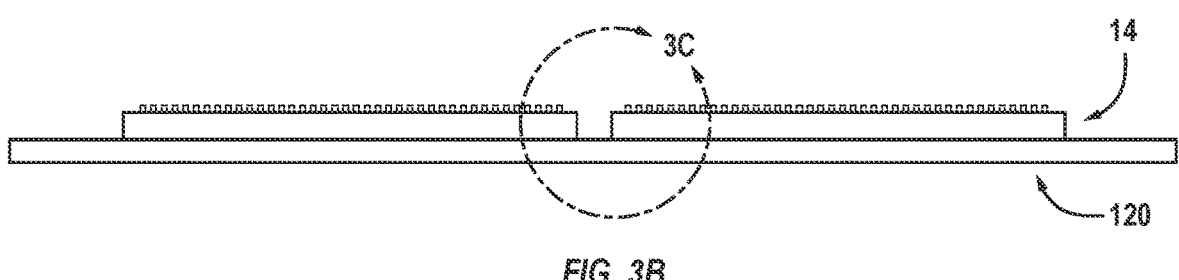

FIG. 3B, illustrates a cross-sectional profile view of components 14 or 44 disposed face-up over a temporary carrier 120, the components 14 each comprising conductive studs 125 disposed over a front side of the components, which when present, can be the active layer 18. In some instances, the temporary carrier 120 may be a metal carrier, a silicon carrier, a glass carrier, or a carrier made of other suitable material used for the molding or encapsulating process, and then be removed after the encapsulant, such as mold compound, filled epoxy film such as ABF, or other dielectric such as polyimide has been placed, cured, or both, such that the encapsulant provides structural support and the temporary carrier is no longer needed for processing. The components 14 may be placed adjacent or laterally offset one another, such as in a side-by-side arrangement, so that multiple components 14 may be disposed within the reconstituted wafer 134 at a panel level (as shown, e.g., in FIG. 3E) and processed through various fabrication steps, before being singulated into individual assemblies or packages, including QFN, DEN or SON packages 300. As such, multiple components 14 may also be processed together at a same time over the temporary carrier 120, which will be understood by a POSA, even when a close-up view of just portions of the components 14 are shown.

Figure 3C:
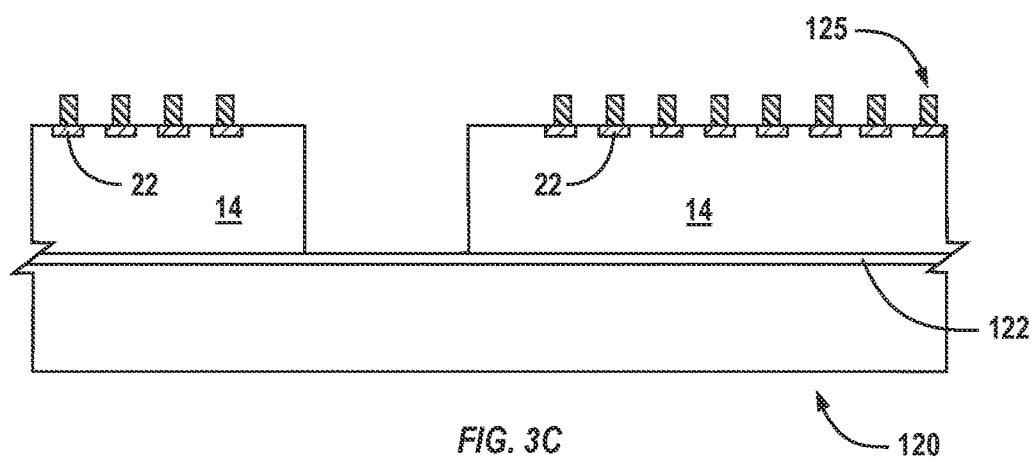

FIG. 3C, illustrates a close-up view of components 14 taken along section marker of FIG. 3B, emphasizing the conductive studs 125 formed over a surface or active layer 20, and aligned on components 14. Although it is not required for every embodiment, the conductive studs 125 of the particular embodiments illustrated herein are shown about a perimeter of the components 14 for the particular implementation in which they will be used. An optional interface layer 122, such as double-sided tape, film or deposited material, may be used beneath the components 14 to temporarily hold them to the temporary carrier 120 during processing.

Figure 3D:
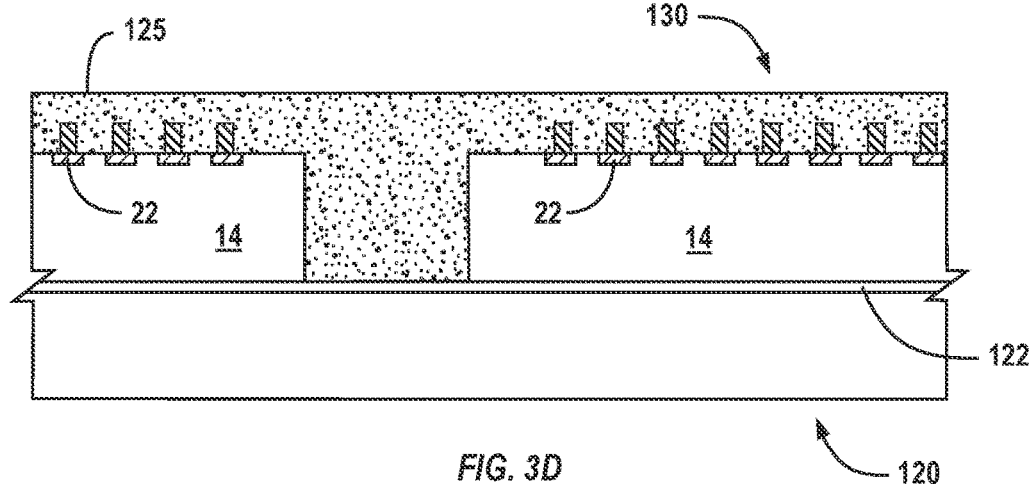

FIG. 3D, continuing from FIGS. 3B and 3C, illustrates disposing an encapsulant 130 around the components 14 face-up over a temporary carrier 120 around four side surfaces of the component 14, over the frontside of the components 14, and around the conductive studs 125. As used herein, over, on or around may mean in direct contact with, or with other intervening layers, such as polymer or polyimide layers disposed between the chips 14 and the encapsulant 130. The conductive studs 125 formed over the active layer of the components 14 may be in contact with, surrounded by, partially encircled by, or encapsulated or molded with a single encapsulant, polyimide or mold compound at a single step such that the same encapsulant, polyimide or mold compound 130 is disposed around the components 14, including at least 4 side surfaces. The encapsulant 130 can be deposited around the plurality of components 14 using a paste printing, compression molding, transfer molding, liquid encapsulation, dispensing, lamination, vacuum lamination, spin coating, slit or slot die coating, or other suitable application. The encapsulant 130 comprises an organic material, a mold compound, a polyimide, a composite material, such as epoxy resin with filler, such as ABF or epoxy acrylate with filler, and is a material suitable for planarizing, such as through chemical mechanical planarizing (CMP) or grinding. As such, in some instances the encapsulant 130 will not be a polymer material, such as an un-filled polyimide, that may not perform well in a grinding operation, and may gum-up a grinding wheel. FIG. 3F illustrates the planar surface 132 with the conductive studs 125 exposed.

Figure 3E:
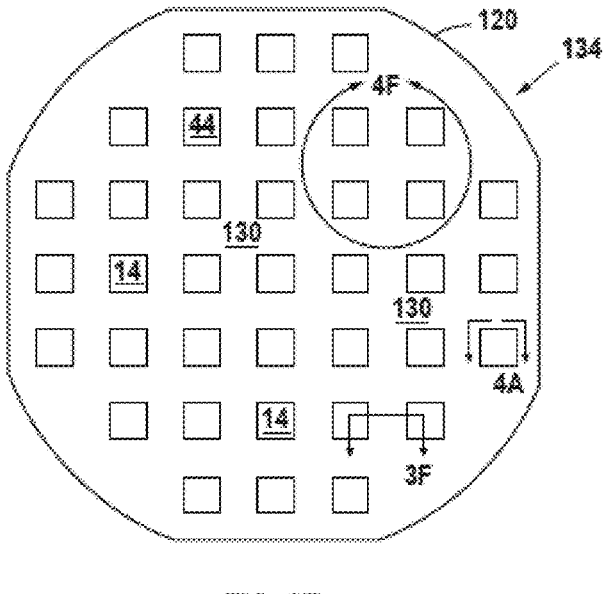
Figure 3F:
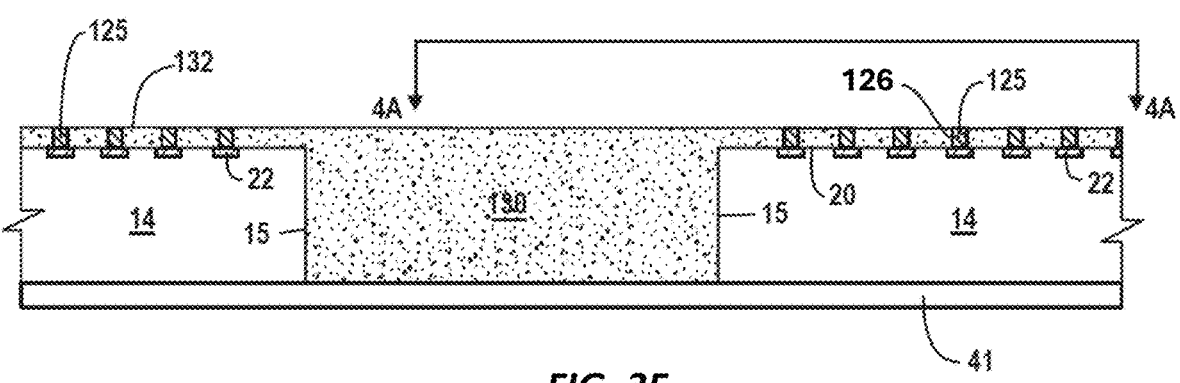

FIG. 3E, continuing from FIG. 3D, is a plan view of the entire reconstituted wafer or panel 134, of which FIG. 3D is a cross-sectional side view of a portion of the reconstituted wafer 134, taken along the section line 3D. FIG. 3E presents a plan view of the components 14 within panel 134, and similar to the plan view of the components 14 over the carrier 120 shown in FIG. 3A. FIG. 3E differs from FIG. 3A by the inclusion of encapsulant 130 disposed over, around, or both over and around the components 14.

FIG. 3E illustrates the encapsulant 130 can be deposited around the plurality of components 14 using a paste printing, compression molding, transfer molding, liquid encapsulant molding, lamination, vacuum lamination, spin coating, or other suitable application method. The encapsulant 130 can be a polymer composite material, such as epoxy resin with filler commonly referred to as Electronic Mold Compound or EMC, epoxy acrylate with filler, ABF (Ajinomoto Build-up Film®), or other polymer with proper filler. Components 14 can be embedded together in encapsulant 130, to form a panel, reconstituted panel, wafer, or reconstituted wafer 134, that allows for the processing and packaging of multiple components 14 at a same time to form a plurality of assemblies, packages, including QFN, DFN, SON, or BGA packages. The panel 134 can be non-conductive and provide mechanical rigidity as well as environmentally protect the components 14 from external elements and contaminants.

The panel 134 can optionally undergo a curing process to cure encapsulant 130. A surface of encapsulant 130 can be substantially coplanar with adhesive 41, as illustrated in FIG. 3F. Alternatively, encapsulant 130 can be substantially coplanar with backside 18, the encapsulant being exposed by the removal of carrier and interface layer. The reconstituted panel 134 can include a footprint or form factor of any shape and size including circular, rectangular, or square, such as a form factor in a range of 200-600 millimeters (mm), including that of a semiconductor wafer including a circular footprint having a diameter of 300 mm. Any other desirable size can also be formed.

FIG. 3F, continuing from FIG. 3D and FIG. 3E, also illustrates that after molding or placement of encapsulant 130, the temporary carrier 120 may be removed. In some instances, and a backside or back surface 18 of the components 14 may be exposed from the encapsulant 130 and from other layers. Alternatively, in other instances a backside laminate, encapsulant, die attach film (DAF) or other material 41 may be disposed over the backside of the components 14 as shown in FIGS. 2C and 3F. Thus, in some instances the backside laminate (including polyimide or mold compound) may be more than temporary and may become part of the final product, or may be removed at a later process step, such as at a grinding or polishing step. Different processing steps may be included to result in the backside of the semiconductor chip being exposed with respect to, or covered by, encapsulant or other material.

Planarizing or grinding the encapsulant 130 over the frontside or active layer 20 to expose the conductive studs 125 may occur before or after removing the temporary carrier 120. As referenced above, FIG. 3F illustrates a close-up view of a portion of the components 14 after planarizing the encapsulant 130 over the frontside or active layer 20 of the components 14 to create a planar surface 132 comprising exposed ends of the conductive studs 125 and further comprising a planarized encapsulant surface. The planarizing or grinding of the encapsulant produces a flatness of within a range of about 0.5-2.0 micrometers (μm) and a total roughness height from peak to valley of between 5 nanometers (nm) and 2 μm measured over a characteristic measurement distance, which may comprise a distance or length of about 1 millimeter (mm). While conventional encapsulant grinding might be done with less flatness, greater accuracy and precision can be obtained by using integrated sensors such as laser, acoustic, or other non-contact methods to control the grinding resulting in better flatness. In some instances, the first conductive studs 125 may be formed with a height of less than or equal to about 50 micrometers (μm) or less than or equal to about 250 μm, and then be ground down to a height of less than its original height, such as, in a particular embodiment, less than or equal to about 4 μm or 1 μm. As used herein, "about" or "substantially" means a percent difference less than or equal to 50% difference, 40% difference, 30% difference, 20% difference, 10% difference, or 5% difference.

Figure 4A:
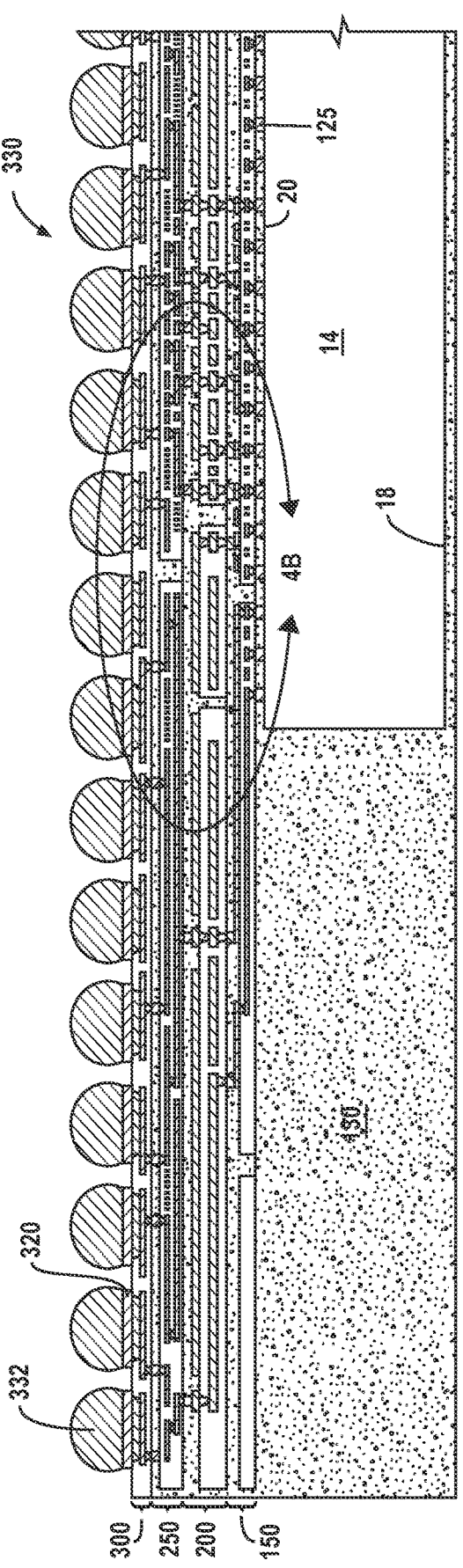
FIGS. 4A-4H illustrate components, such as semiconductor die, chips, and embedded devices having a heterogeneous stacked molded direct contact and dielectric structure formed thereon.

FIGS. 4A-4H, 5A-5B, 6A-6B, and 7 illustrate various views of forming layered structures 150, 200, 250, 350 (or any desired number of layered structures) comprising encapsulant 180, 230, 280, 380 respectively, with separate dielectric layers 160, 210, 260, 360 and conductive layers 154, 204, 254, 354, respectively, formed over or under the encapsulant layers 180, 230, 280, 380, respectively, to form the layered structure. Multiple such layered structures 150, 200, 250, 350 may be used as part of the same semiconductor assembly or package 330 (comprising a component 14) or substrate (without a component or chip 14). By forming the semiconductor assembly 330 with layered structures 150, 200, 250, 350 a number of advantages are achieved, as described in more detail herein. As illustrated in FIG. 4A (and other FIGs.), the vertically spaced encapsulant layers 180, 230, 280, 380 are formed as part of the layered structures 150, 200, 250, 350 such that the encapsulant layers 180, 230, 280 are disposed between, sandwiched within, or interleaved with, the vertically stacked or spaced (i) one or more layers of conductive layers 154, 204, 254, 354 (including RDLs 156, 206, 256 and traces 158, 208, 258), and (ii) a dielectric layers 160, 166, 210, 216, 260, 266, and 360 that are non-mold material or non-encapsulant material such as a polymer, polyimide, organic dielectric or inorganic dielectric or other suitable dielectric as known in the art.

Planarization of the encapsulant layers 180, 230, 280, 380 reduces topography issues with greater flatness, planarity, and uniformity. As illustrated in FIGS. 1A-1E and known in the prior art, the deformations 510, including dips, waves, or undulations which result from following the contours from lower layers, can increase or be exaggerated in subsequently formed layers, increasing or exacerbating the deformations 510 and creating inability to form fine pitch lines due to photolithography or patterning issues, reliability and other problems. The deformations 510 can make it very difficult and infeasible to produce RDLS traces, or other structures with more than 2 layers of 2 μm line and space (4 μm pitch). Similarly, submicron line and space pitch are very difficult and infeasible, given the lack of planarity or flatness, thereby increasing cost and reducing other desirable attributes of processing or the final structure. The above issues of deformations 510 may be reduced, limited, accounted for, or ameliorated with the layered structures 150, 200, 250, 350 comprising planarized or flat encapsulant layers 180, 230, 280, 380 and method for making the same as disclosed herein and as shown and further discussed with reference to FIG. 7. FIG. 7 illustrates additional detail of how deformations 510 of conductive layers 154 may present within layered structure 150, and may further be ameliorated with the encapsulant layer 180. A POSA will appreciate that the same amelioration will be present for layered structures 150, 200, 250, 350 (and any desired number of layered structures), but for simplicity and ease of illustration is not expressly called out in FIGS. 4A-4H, 5A-5B, and 6A-6B.

FIG. 4A, and subsequent figures, illustrate the semiconductor assembly or package 330 may comprise a semiconductor component 14 comprising conductive studs 125 formed over and coupled to a frontside or active layer 20 of the semiconductor component 14. The first encapsulant 130 may be disposed around and contacting at least four side surfaces 15 of the semiconductor component 14, disposed over the frontside or active layer 20 of the semiconductor component 14, and disposed so as to contact at least a portion of a side surface 126 of the conductive studs 125. A first layered structure 150 may be formed as a build-up interconnect structure over the encapsulant 130 and over the semiconductor component 14. The first layered structure 150 may be formed as a fan out interconnect structure 151. A second layered structure 200 may be formed as a build-up interconnect structure over the first layered structure 150 and on the flat surface 184 to improve a flatness of the second layered structure 200.

Forming the first layered structure 150 may comprise forming a first conductive layer 154, comprising a RDL 156, disposed over the first encapsulant 130 and coupled with the conductive studs 125. The conductive layer 154 may comprise one or more of a RDL 156, one or more traces 158, which may be disposed over the first encapsulant 130 and coupled with the conductive studs 125. The first conductive layer 154 may be formed over the encapsulant 130, the component 14, or both as shown in FIG. 4A. In some instances, the conductive layer 154 may comprise conductive routing, traces 158, as well as other features. The conductive layer 154 may comprise one or more features, including traces, land pads, capacitors, inductors, shielding, resistors, antenna or antenna feed, or other feature or structures. The discussion relating to the first conductive layer 154 is also applicable to the other conductive layers 154a, 154b, 154x, 204, 204a, 120b, 204x, 254, 254a, 254b, 254x, 304, 304a, 304b, and 304x.

The conductive layer 154 can be one or more layers of Al, Cu, Sn, Ni, Au, Ag, Ti, W, Ta, Co, or a coupling agent, or other suitable electrically conductive material. The conductive layer 154 can be formed using PVD, CVD, electrolytic plating, electroless plating, or other suitable process. The conductive layer 154 can be built-up inside of a patterned material, such as a patterned photoresist, such that the conductive layer takes on the pattern of the patterned material. In other cases, the conductive layer 154 can be deposited as a non-patterned material and then patterned after being deposited using a patterned material, such as a patterned photoresist, whose openings allow etching of the underlying conductive layer 154 thereby resulting in a patterned conductive layer 154. In an embodiment, the conductive layer 154 can comprise a Ti diffusion barrier layer or barrier layer, a Cu seed layer, and a Cu layer formed over the Ti barrier layer and the Cu seed layer. Typically, the barrier and seed layers are deposited by a PVD process, such as sputtering. In addition to providing good adhesion and acting as a diffusion barrier to the underlying material it is deposited on, the barrier and seed layers provide a plating bus that can enable electrolytic plating of a conductor (such as a plated conductive element) over the seed layer.

Figure 4B:
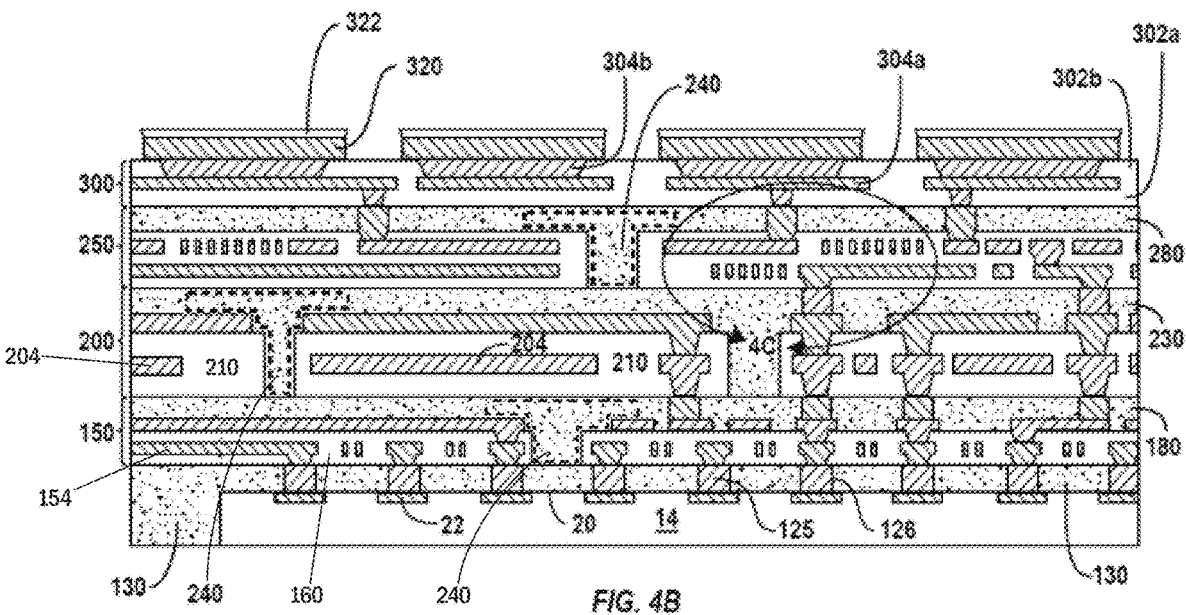
Figure 4C:
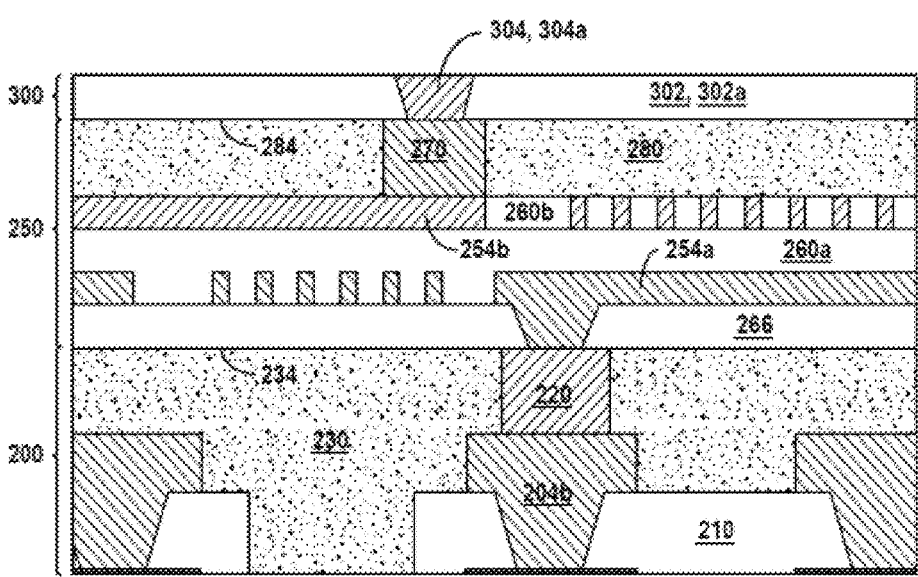

FIG. 4C illustrates an example in which the dielectric or insulating layer 260 may be formed over the third conductive layer 254 and may comprise polyimide or other suitable material. The third dielectric 260 may be formed at least partially around, contact, reinforce, or support the conductive layer 254. Third dielectric layer 260 may comprise one or more layers (e.g. 260a, 260b) of insulating or dielectric material that are applied (e.g. over encapsulant 230, conductive layers 254a, 254b) using PVD, CVD, screen printing, spin coating, spray coating, sintering, thermal oxidation, or other suitable process. Dielectric layers 260 can contain, without limitation, one or more of an organic material, an inorganic material, and a polymer including one or more layers of $SiO_2$, $Si_3N_4$, SiON, CDO, $Ta_2O_5$, $Al_2O_3$, polyimide, BCB, PBO, or other material having suitable insulating and structural properties.

The discussion relating to the first dielectric layer 260 is also applicable to the other dielectric layers 160, 166, 210, 216, 266, 302, and 360.

The first dielectric layer 160 may be formed around the conductive layer 154, including being formed as one or more layers below, above, and completely or partially surrounding the first conductive layer 154. The first dielectric layer 160, e.g., when made of polymer or polyimide, can provide higher resistance to leakage currents or higher breakdown voltage than mold compound for high voltage applications, as well as superior electrical performance for high frequency signals.

The first dielectric layer 160 and the layered structures 150, 200, 250 can include one or more of the features or approaches presented in U.S. Pat. Application 63/347,516 titled "Molded Direct Contact Interconnect Build-up Structure Without Capture Pads," filed May 31, 2022, as well as the features and approaches presented in U.S. Pat. Application 63/391,694 titled "Molded Direct Contact Interconnect Substrate," filed Jul. 22, 2022 may also be used. U.S. Pat. Application 63/347,516 and U.S. Pat. Application 63/391, 694 (in their entireties) are hereby incorporated by reference herein.

Via holes, openings, or trenches 162 in the first dielectric layer 160 can be formed to facilitate subsequent electrical interconnection with one or more conductive layers, or to provide structural support or a thermally conductive path. In other instances, one or more layers of dielectric material 160, or others, may comprise holes, trenches, or openings through the polymer or polyimide (non-encapsulant layers) so that layers of encapsulant can interlock or connect through the openings and through the dielectric layer 160 to improve mechanical connection.

Conductive stumps 170 may be coupled to the first conductive layer 154 and exposed with respect to the first dielectric layer 160. Conductive stumps 170 (like conductive stumps 220, 270) may be similar or identical to conductive studs 125 but may be formed away from the component 14 and coupled with the conductive layer 154 (or conductive layers 204, 254, 304, or other suitable conductive feature including heat sinks and flags).

A second encapsulant 180 may be disposed over the first conductive layer 154, over the first dielectric layer 160, and over the conductive stumps 170. The second encapsulant 180 (like the third encapsulant 230, the fourth encapsulant layer 280, or any subsequent encapsulant) may be similar or identical to the first encapsulant 130. As illustrated in FIG. 7, a lower surface 183 of the encapsulant 180 will follow the topography of the underlying dielectric layer, such as dielectric layer 150*b*, or underlying conductive layer, such as conductive layer 154*c* or any other layer upon which it is deposited. An upper surface 182 of the second encapsulant 180 may be planarized to expose the conductive stumps 170 and to create a flat surface 184 on which to form additional structures. Thus, the second encapsulant (like the third encapsulant 230, the fourth encapsulant 280, or any subsequent encapsulant) may be conformal and non-planar on its bottom surface and planar on its upper surface 182.

The second layered structure may be formed comprising a second conductive layer 204 disposed over and coupled to the first layered structure 150. The second dielectric layer 210 may be formed or disposed over the second conductive layer 204. A third encapsulant 230 may be formed (such as deposited and then ground with a grinder 29) to comprise a flat or planarized upper surface 234 disposed over the second conductive layer 204 and over the second dielectric layer 210. A flatness and planarity of the planarized upper surface 234 may be the same or similar to the flatness and planarity of the planarized surface of encapsulant 130.

A portion of one or more encapsulant layers 180, 230, 280, 380 may form a multi-layer encapsulant body 240 (as shown by the dotted lines in FIG. 4B, 4G, 4H or 5B) to provide an interlocking structurally strengthened assembly 330. For example, a portion of the second encapsulant 180 may form a multi-layer encapsulant body 240 that passes through or around one or more of at least a portion of the first conductive layer 154 and the first dielectric layer 160 to directly contact the first encapsulant 130. The multi-layer encapsulant body 240 may also pass through or around one or more of at least a portion of the second conductive layer 204 and the second dielectric layer 210 to directly contact the third encapsulant 230. The second encapsulant 180 and the third encapsulant 230 may be formed without semiconductor chips or additional components 14 being disposed therein.

As illustrated in FIG. 4A, in some instances, the layered structures 150, 200, 250, and build-up interconnect structure 300 may together comprise 7-8 conductive layers of metal, such as 7 conductive RDLs and one conductive UBM layer 320. FIG. 4B, a close-up view of a portion of FIG. 4A that is taken along the detail mark labeled "FIG. 4B" in FIG. 4A, shows an enlarged view of the same.

As a person of ordinary skill in the art (POSA) will appreciate a number of conductive layers, including concurrent RDL layers (or vertically stacked and separated layers used within a single assembly), may be dependent upon specific materials, equipment, as well as routing design and electrical performance requirements. In some instances, one or more conductive layers (with accompanying dielectric layers at one or more positions including over, under, and adjacent sides of the conductive layers) will be used. The one or more conductive layers may be part of a single-layered structure (or multi-layered structure) disposed between (or sandwiched with) encapsulant layers. When dielectric layers are adjacent sides of the conductive layer, the structure will differ from instances in which air gaps are formed along sides or laterally offset from the conductive traces and dielectric is formed over and under the traces.

In other instances, 4 or more conductive layers (with accompanying dielectric layers over, under, or both over and under the conductive layer) will be used for each conductive layer and as part as a single layered structure or disposed between (or sandwiched with) encapsulant layers. Any desired number of layers and layered structures may be used based on desirable outputs and needed constraints, such as yield, cost, and performance. The conductive layers (including RDL layers, signal lines, clock lines, traces, ground planes, power planes, shielding, inductors, or any other desired conductive structure or structure comprising conductive material with other materials) as well as the dielectric layers (including polyimide or other suitable dielectric layer) may comprise thicknesses in a range of 1-20 μm, or 2-7 μm thick.

One to four layers of RDL may be used in each "layered structure". Different thicknesses of copper, and different densities of traces may also be accommodated, including 2 μm line and space for 4 μm pitch, or for larger pitches up to 200 μm, as well as for smaller pitches of 3 μm, 2 μm, or 1 μm. In some cases, it is desirable for electrical performance reasons such as signal integrity, power droop or other factors for conductive layers used primarily for ground or power distribution to be thicker than conductive layers used primarily for signal or clock lines, examples of which are illustrated in—and discussed with respect to—FIG. 5B. The conductive layers can have dielectric above, below, around, or simultaneously above, below and around and in direct contact with each other. Unit specific patterning or customized patterning (i.e. Adaptive Patterning®) for fine pitch and other desired applications can also be used.

One or more additional conductive layers 154*x* or 204*x* may be formed over the first dielectric layer 160, over the second dielectric layer 210, or over both the first dielectric layer 160 and over the second dielectric layer 210. One or more of the second encapsulant 180 and the third encapsulant 230 may be formed or disposed over, and directly contacting, the one or more additional conductive layers 154*x* or 204*x*.

FIG. 4C illustrates a close-up view of a layered structures 200, 250, and conventional build-up interconnect structure 300, taken along the detail line 4C shown in FIG. 4B. As illustrated, the conventional build-up interconnect structure 300 comprises dielectric 302 or lower portion 302*a* of the same as well as conductive layer 304 or a lower portion 304 of the same. When forming the layers of encapsulant (such as encapsulant 230 and 280), the encapsulant may comprise a mold compound that is placed using a mold. Use of the mold can result in the upper surface of the encapsulant or mold compound having a flat or planar surface (e.g. 234 or 284). In some instances, the encapsulant may be molded or placed at a desired thickness with the upper surface of the mold compound having a flat or planar surface, as a result of the mold surface, and the flat or planar molded surface may be left as is, having been molded to a desired height. In other instances, the encapsulant can have a portion of the material removed, such as by grinding with grinder 29. FIG. 4C also illustrates conductive stump 22 formed over and coupled with second conductive layer 204. Third conductive layer 254*a* is formed over interstitial dielectric layer 266 and under a lower portion 260*a* of the third dielectric. Upper portion 254*b* of the third conductive layer and upper portion 260 of the third dielectric layer are also formed thereover as part of the third layered structure 250.

Figure 4D:
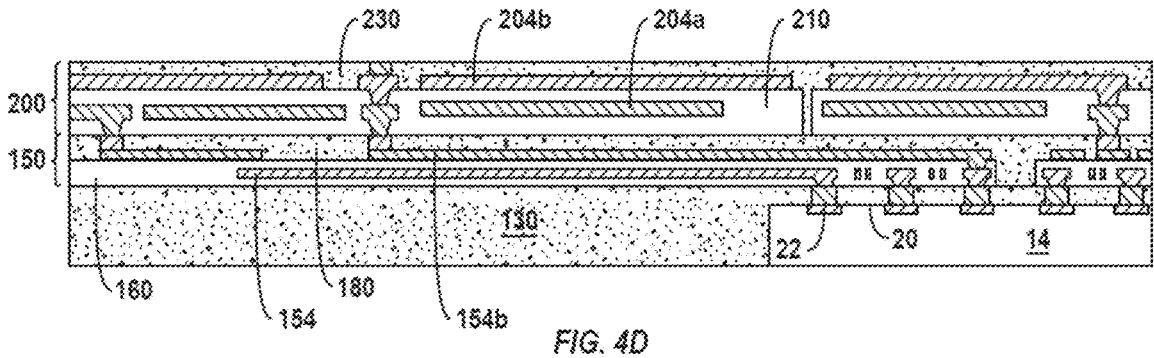

FIG. 4D illustrates an exemplary layered structure, from part of a larger semiconductor assembly 330. By having layers of encapsulant between (or interleaved with) one or more conductive layers and dielectric layers, the topography variations (as illustrated in FIGS. 1A-1E) can be limited, stopped, or "reset" with each encapsulant layer (see, e.g., FIG. 7), providing for a new planar or flat surface onto which subsequent conductive layers are formed, while also providing improved electrical characteristics and performance of conductive layers formed above, below, and around the dielectric layers. In FIG. 4D, the top conductive layer 154*b* and 204*b* in layered structures 150 and 200, respectively, are formed with dielectric 160 and 210 under but not over the conductive material 154*b* and 204*b*.

FIG. 4D also illustrates that an interstitial dielectric layer 166 may be disposed between the first encapsulant 130 and the first conductive layer 154 and provide improved performance for the first conductive layer 154. In some instances, one or more of the first dielectric layer 160, the second dielectric layer 210, and the interstitial dielectric layer 166 comprise polyimide. In other instances, such as illustrated in FIG. F, 5A or 5B, the first conductive layer 154 may be formed directly on or directly contacting the first encapsulant 130 without an interstitial dielectric layer 166 disposed therebetween.

Figure 4E:
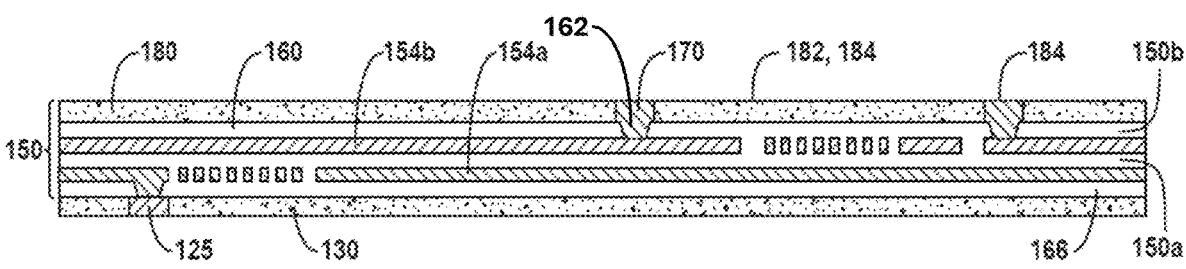

FIG. 4E illustrates another exemplary layered structure, which differs from that shown in FIG. 4D because the top conductive layer 154*b* in the layered structure 150 is formed with dielectric 160 both under (160*a*) and over (160*b*) the conductive material 154*b*.

Figure 4F:
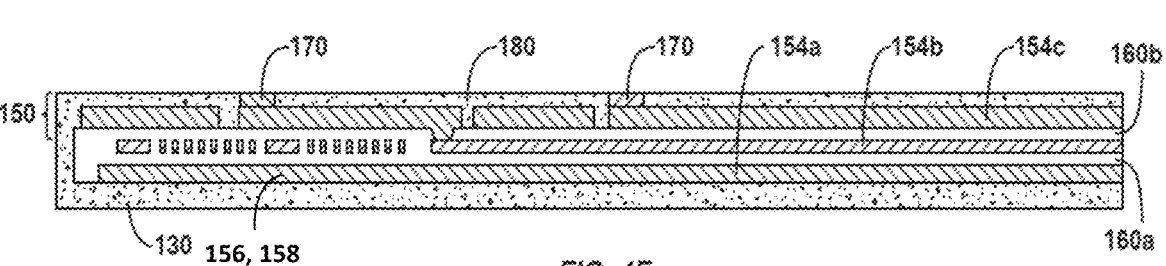

FIG. 4F illustrates another exemplary layered structure, which differs from that shown in FIGS. 4D and 4E because the bottom (or first) conductive layer 154*a* in the layered structure 150 is formed directly on the encapsulant or mold compound 130 without first forming an additional interstitial dielectric 166 directly under or contacting the conductive layer 154*a*. An example of a structure or package 330 using such a feature is shown, e.g., in FIG. 5A.

Figure 4G:
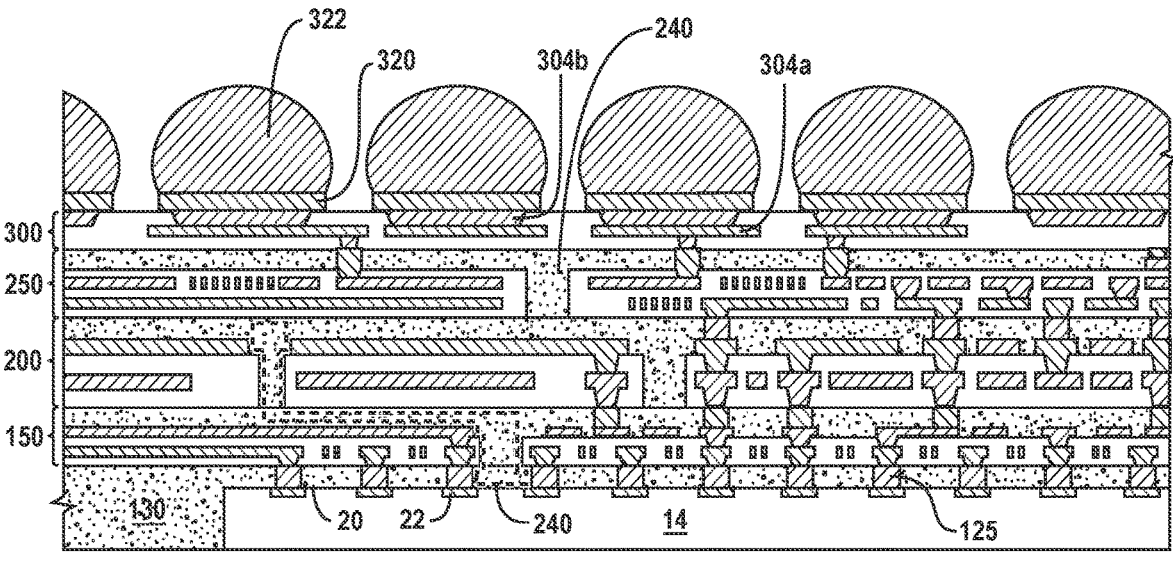

FIG. 4G illustrates a portion of the second encapsulant 180 forms a multi-layer encapsulant body 240 that passes through or around at least a portion of the first conductive layer 154 and the first dielectric layer 160 to directly contact the first encapsulant 130. Similarly, a portion of the second encapsulant 180 forms a multi-layer encapsulant body 240 that passes through or around at least a portion of the second conductive layer 204 and the second dielectric layer 210 to directly contact the third encapsulant 230. As such, the multi-layer encapsulant body 240 provides interlocking encapsulant or mold compound that provides adhesion among vertically separated layers of encapsulant or mold compound.

In some instances, an upper portion of one or more layered structures may be formed without an encapsulant disposed over the conductive layer and the dielectric layer. Or in other words, a conventional build-up interconnect structure 300 may be formed over one or more layered structures 150, 200, 250, or any desired number of layered structures.

Figure 4H:
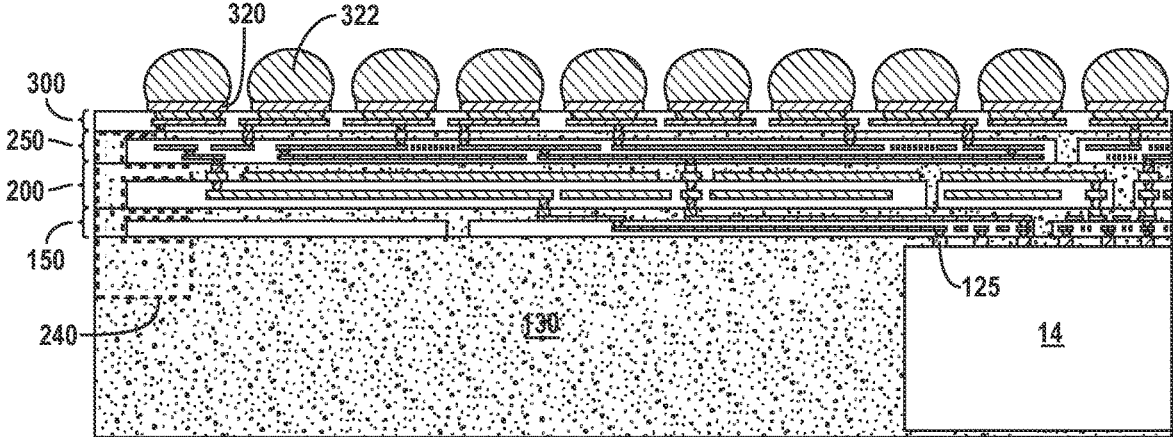

FIG. 4H illustrates another example in which the encapsulant 130, 180, 230, 280 forms a multi-layer encapsulant body 240 by extending vertically through layered structures at a package edge to interconnect various layered structures or layers of dielectric and conductive layers for interlocking the encapsulant or mold compound and providing adhesion among vertically separated layers of encapsulant or mold compound.

FIG. 4H further illustrates that package interconnects 322 may be formed over the second layered structure 200, over the planarized upper surface 234, and over other subsequently formed layers. The package interconnects 322 may comprise one or more of solder bumps, a LGA, pins, or a BGA, phased array antenna, or other suitable or desired structure.

Figure 5A:
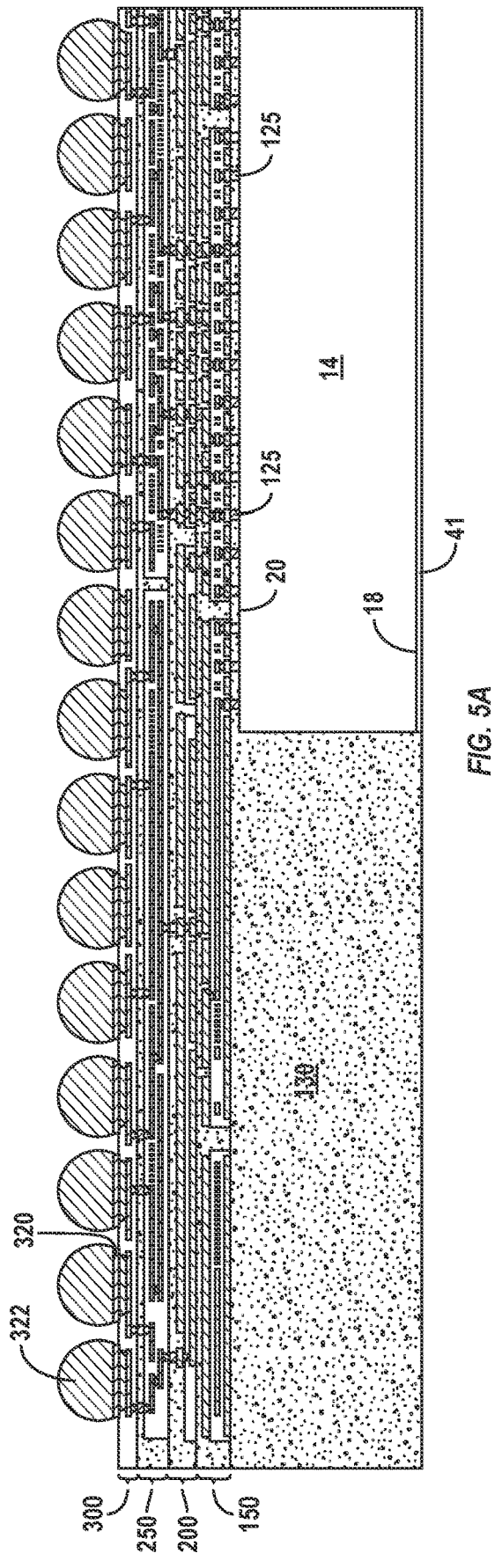
FIGS. 5A and 5B illustrate a heterogeneous stacked molded direct contact and dielectric structure formed over one or more components.
Figure 5B:
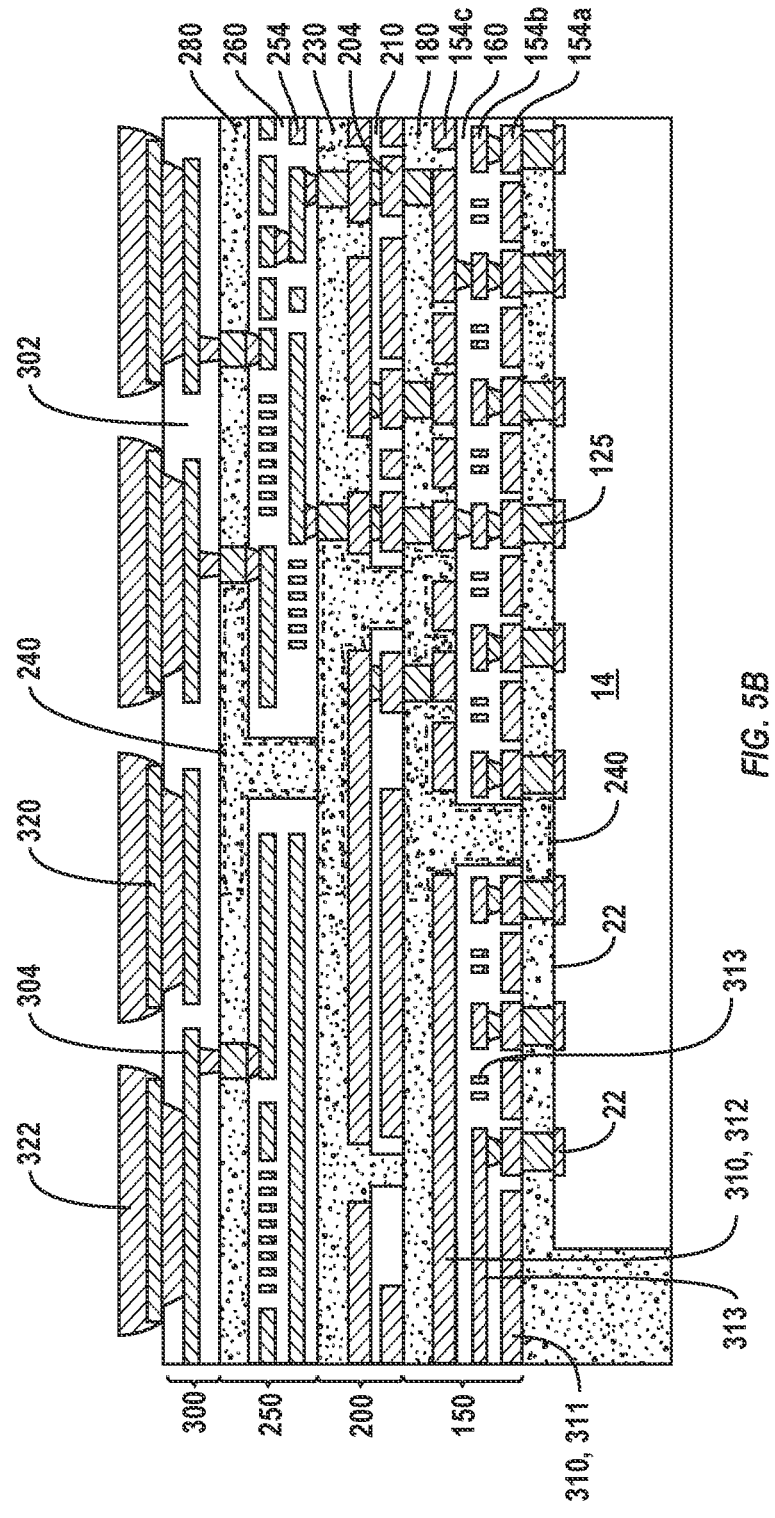

FIGS. 5A-5B illustrate various views of forming layered structures comprising encapsulant, with separate dielectric layers and conductive layers formed over or under an encapsulant layer to form a layered structure, similar to what was shown in FIGS. 4A-4H. FIG. 5A differs from FIG. 4A by forming the first conductive layer 154*a* directly contacting the encapsulant material 130, which encapsulates or is disposed around the semiconductor component 14.

FIG. 5B, includes a close-up view of a portion of FIG. 5A. As illustrated in FIG. 5B, in some instances the semiconductor assembly 330 may comprise multiple layered structures 150, 20, 250, which together may comprise 9 conductive layers of metal, such as 8 conductive RDLs and one conductive UBM layer 320. Different configurations of features may be adjusted within the semiconductor assembly 330 to accommodate device requirements and other needs. Layer thicknesses of dielectric and RDL can be tailored as desired. Any desired number of layers and layered structures may be used based on desirable outputs and needed constraints, such as yield, cost, and performance.

FIG. 5B further illustrates an instance in which a first layered structure 150 may be formed as follows. First, one or more first conductive layers 154, such as lower conductive layer 154*a*, middle first conductive layer 154*b*, and upper first conductive layer 154*c* may be formed over or directly on the encapsulant 130 and may be formed as a plane 310 (such as ground plane 311 or a power plane 312). The first dielectric layer 160 may then be formed over the first lower conductive layer 154*a*. The middle first conductive layer 154*b*, may be formed as a layer that is thinner than the first lower conductive layer 154*a*, and may be formed over the first dielectric layer 160. The first conductive layer 154, including one or more of 154*a*, 154*b*, and 154*c* and as illustrated with 154*b* in FIG. 5B, may be formed as part of stripline or as a microstrip, differential pair, or an impedance-controlled structure for conducting or transmitting signals. An upper first dielectric layer 154*c* may comprise a thickness similar to a thickness of the first lower conductive layer 154*a* that is greater than the thickness of the middle first conductive layer 154*b*. Various layers of the first conductive layer 154 may be formed as thicker layers when they are formed as a power plane, ground plane, a clock or a portion of clock tree (such as within RDLs as part of a chiplet). Dielectric layer 160 or other dielectric layer may be thinner or thicker for improving or optimizing electrical performance based on the design and function or particular aspects. A thinner signal line layer, such as middle first conductive layer 154*b*, may be used to minimize broadside coupling capacitance and thicker power plane 312 and ground plane 311 may be used to minimize power distribution network impedance. The planes 310, such as a ground plane 311 or power plane 312, may be formed as part of a power plane pair. While the features of a stripline, a microstrip, a differential pair, an impedance-controlled structure for conducting or transmitting signals, planes 310, ground plane 311, and power plane 312 have been described with respect to conductive layer 154 and the first layered structure 150, a POSA will appreciate that the same or similar features may be formed as part of any other conductive layer and as part of any other layered structure, such as the second layered structure 200 and the third layered structure 250.

Figure 6A:
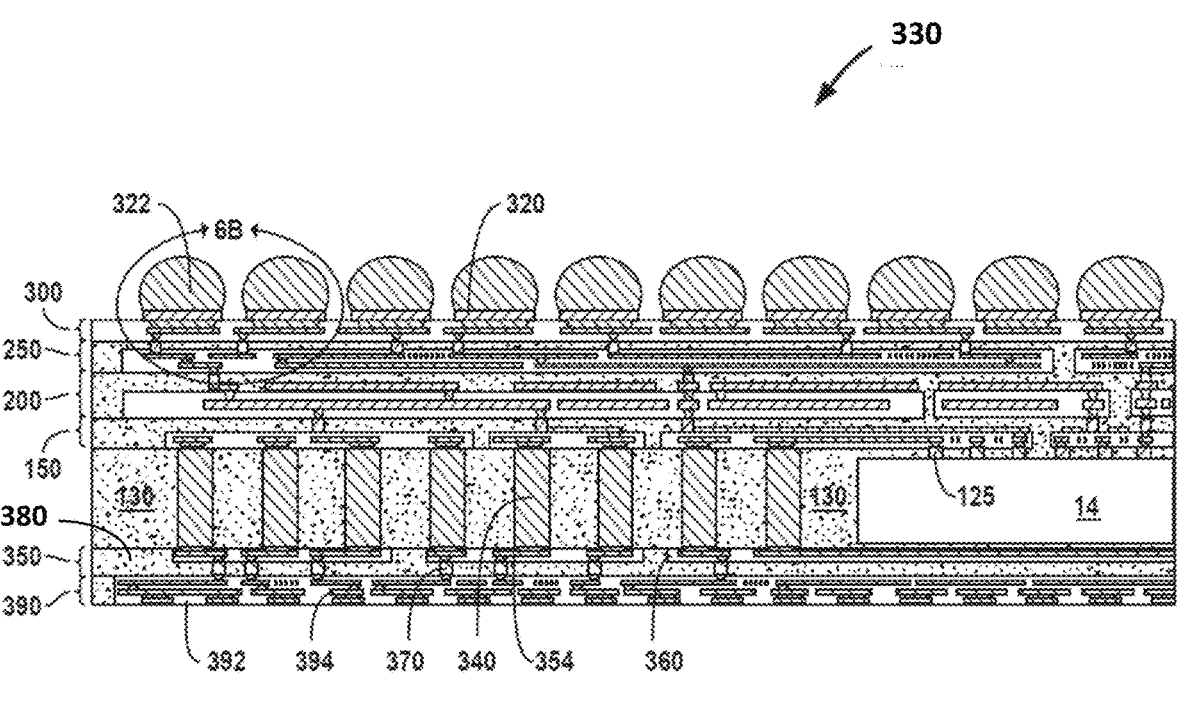
FIGS. 6A and 6B illustrate additional features of layered structures, including conductive stumps contacting encapsulant and dielectric, and both frontside and backside layered structures.
Figure 6B:
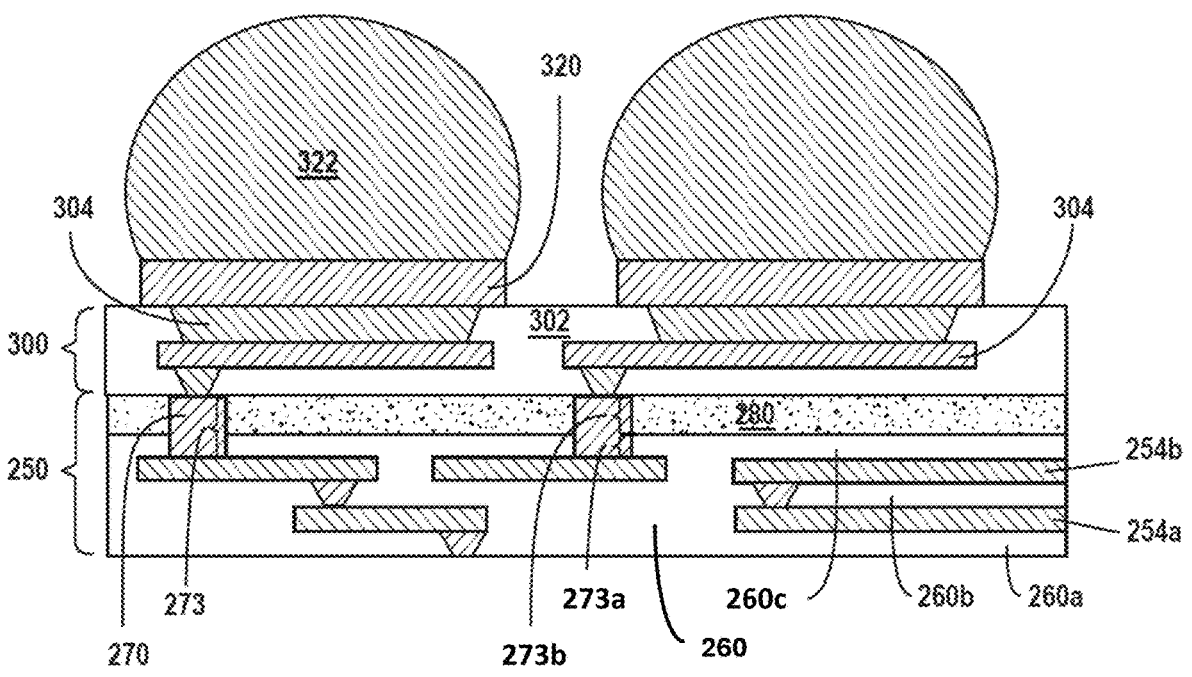
Figure 7:
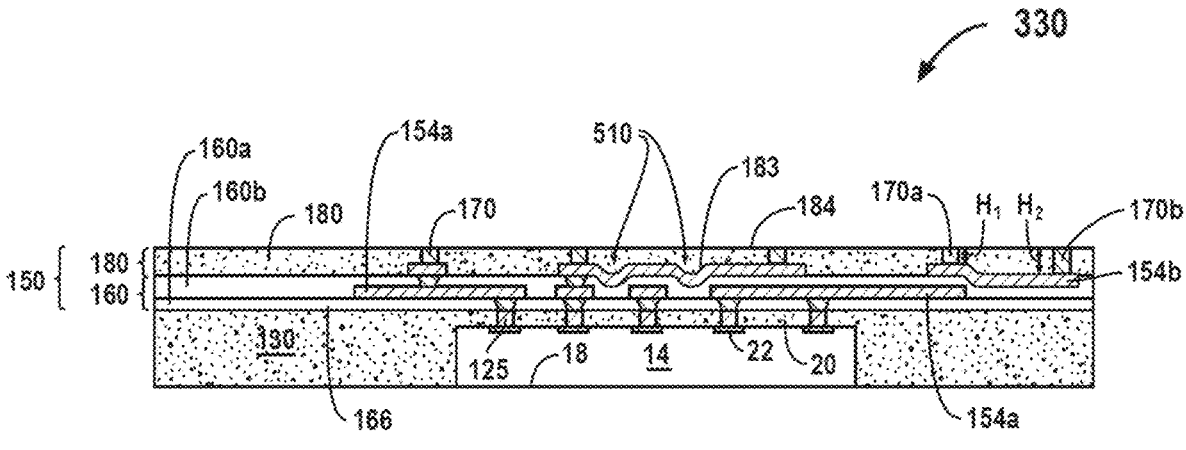
FIG. 7 illustrates additional detail for the semiconductor assembly comprising layered structures and the deformations of the conductive layers within the same.

FIG. 6A illustrates additional detail for a number of features. FIG. 6B illustrates an instance in which both dielectric 260 and encapsulant 280 are touching or contacting a sidewall 273 of conductive stump 270. FIG. 6A illustrates layered structures over both the frontside 20 and the backside 18 of component 14 or of the assembly 330. The first layered structure 150 is coupled to the backside layered structure 350 through the conductive through mold vertical interconnects 340. The backside layered structure or backside build-up interconnect structure 350 comprises a backside conductive layer 354 that may be similar to conductive layer 154 (as depicted in FIG. 5B), and further comprises a backside dielectric, insulating, or passivation layer, 360 that may be similar to dielectric layer 160 (as depicted in FIG. 5B). The backside layered structure 350 further comprises the conductive stump 370, which may be similar to conductive stump 170 (as seen in FIGS. 4E, 4F). The backside layered structure 350 also comprises backside encapsulant layer 380, comprising flat upper surface 284 that can be similar to the second encapsulant 180 and flat upper surface 184, respectively. A backside conventional build-up interconnect structure 390, similar to conventional build-up interconnect structure 300, may be formed over the backside layered structure 350. The backside conventional build-up interconnect structure 390 may comprise dielectric layers 392 and conductive layers 394.

FIG. 6B illustrates an enlarged or close-up view of a portion of FIG. 6A indicated by the detail marker 6B shown in FIG. 6A. More specifically, FIG. 6B illustrates the third dielectric layer 260 may be formed such that an upper portion 260c of the third dielectric layer 260 is in contact with a lower portion 273a of a sidewall 273 of the conductive stumps 270. Further, the fourth encapsulant 280 may be in contact with an upper portion 273b of the sidewall 273 of the conductive stumps 270.

FIG. 7, as referenced above, illustrates additional detail for how layered structures, such as a first layered structure 150 can use an encapsulant, such as encapsulant 180, to correct for deformations 510. Deformations 510 may be limited or not present in the lower first conductive layer 154a and the lower first dielectric 160a. Deformations 510 may be present and more pronounced or exaggerated in the upper first conductive layer 154b and in the upper first dielectric 160b by being formed over patterned portions of the lower first conductive layer 154a. A second encapsulant may be formed over the first conductive layer 154a, the lower first dielectric 160a, the first conductive layer 154b, and the upper first dielectric 160b to form the top or upper portion of the layered structure 150. A lower surface 183 of the second encapsulant 180 comprises an undulating contour that follows the deformation 510 of the upper first conductive layer 154b. The flat upper surface 184 of the second encapsulant 180 is formed such that it does not comprise an undulating contour and does not follow the deformation 510 of the upper first conductive layer 154b or the lower surface 183.

Given the differences in thickness of the encapsulant 180 resulting from the undulating contour lower surface 183 of the second encapsulant 180 and the flat upper surface 184 of the second encapsulant 180, conductive stumps 170 extending through the second encapsulant 180 will also comprises different heights. As an example, FIG. 7 illustrates a shorter conductive stump 170a comprising a first height $H_1$ and a taller conductive stump 170b comprising a second height $H_2$.

FIG. 8A illustrates a method of making a semiconductor assembly 400. Element 410 of the method comprises providing a semiconductor component comprising a first encapsulant disposed around the semiconductor component. Element 414 of the method comprises forming a first layered structure comprising a first dielectric layer, a conductive layer, and an encapsulant disposed over the dielectric and the conductive layer. Element 415 of the method comprises planarizing an upper surface of the second encapsulant of the first layered structure. Element 416 of the method comprises forming a second layered structure comprising a second dielectric layer, a second conductive layer, and a third encapsulant disposed over the second dielectric and the second conductive layer. Element 417 of the method comprises planarizing an upper surface of the third encapsulant of the second layered structure.

Figure 8B:
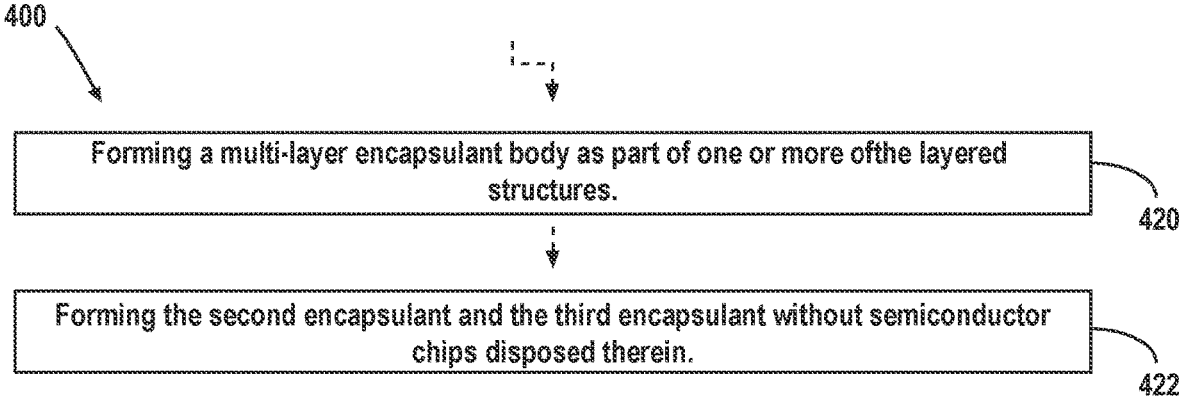

FIG. 8B further illustrates additional elements that may optionally be included in the method of making the semiconductor assembly 400. Element 420 of the method comprises forming a multi-layer encapsulant body as part of one or more of the layered structures. Element 422 of the method comprises the second encapsulant and the third encapsulant are formed without semiconductor chips disposed therein.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Many additional implementations or variations are possible, as will be appreciated by a POSA. Additionally, it will be understood by POSAs that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor assembly, comprising:

provide a semiconductor component disposed within a first encapsulant, the first encapsulant disposed around and contacting at least four side surfaces of the semiconductor component and disposed over a frontside of the semiconductor component; and forming a first layered structure as a build-up interconnect structure over the first encapsulant and over the semiconductor component, wherein forming the first layered structure comprises:

forming a first conductive layer over the first encapsulant, forming a first dielectric over the first conductive layer, forming a second conductive layer over the first dielectric, disposing a second encapsulant over the first and second conductive layers and over the first dielectric, wherein the second encapsulant is formed over, and directly contacting, the second conductive layer, and planarizing an upper surface of the second encapsulant to create a flat surface on which to form additional structures, wherein a portion of the second encapsulant forms a multi-layer encapsulant body that passes between portions of the first conductive layer and the first dielectric layer to directly contact the first encapsulant.

2. The method of claim 1, wherein the second encapsulant and a third encapsulant are formed without semiconductor chips disposed therein.

3. The method of claim 1, wherein the multi-layer encapsulant body comprises a portion of a third encapsulant that passes through at least a portion between portions of the second conductive layer and a second dielectric layer to directly contact the second encapsulant.

4. A method of making a semiconductor assembly, comprising:

providing a semiconductor component disposed within a first encapsulant, the first encapsulant disposed around and contacting at least four side surfaces of the semiconductor component and disposed over a frontside of the semiconductor component; and forming a first layered structure as a build-up interconnect structure after forming the first encapsulant, such that the first layered structure is disposed over and directly contacts the first encapsulant and is disposed over the semiconductor component, wherein forming the first layered structure comprises:

forming a first conductive layer over the first encapsulant, forming a first dielectric over the first conductive layer, disposing a second encapsulant over the first conductive layer and over the first dielectric, and planarizing an upper surface of the second encapsulant to create a flat surface on which to form additional structures, wherein the second encapsulant passes between openings in the first dielectric to contact the first encapsulant, forming a multi-layer encapsulant body.

5. The method of claim 4, wherein an interstitial dielectric is disposed between the first encapsulant and the first conductive layer.

6. The method of claim 4, wherein the first conductive layer is formed directly on the first encapsulant without an interstitial dielectric.

7. The method of claim 4, further comprising:

forming a second layered structure as a build-up interconnect structure over the first layered structure and on the flat surface to improve a flatness of the second layered structure; and wherein the first layered structure and the second layered structure each comprise a redistribution layer (RDL).

8. The method of claim 4, further comprising forming package interconnects over the first layered structure and over the flat surface, wherein the package interconnects comprise one or more of solder bumps, pins, a land grid array (LGA), or a ball grid array (BGA).

9. The method of claim 4, further comprising forming a second layered structure comprising:

a second conductive layer disposed over the first layered structure;

a second dielectric disposed over the second conductive layer; and either a third encapsulant comprising a planarized upper surface disposed over the second conductive layer and over the second dielectric, or a third dielectric comprising vias disposed over the second conductive layer and over the second dielectric such that the second layered structure does not comprise encapsulant.

10. The method of claim 4, further comprising:

forming a conductive stump coupled to the first conductive layer;

forming the first dielectric such that a portion of the first dielectric is in contact with a lower portion of a sidewall of the conductive stump; and disposing the second encapsulant such that a portion of the second encapsulant is in contact with an upper portion of the sidewall of the conductive stump.

11. The method of claim 4, wherein the semiconductor component comprises solderless interconnects formed over and coupled to a frontside of the semiconductor component.

12. A method of making a semiconductor assembly, comprising:

providing a semiconductor component comprising conductive studs formed over and coupled to a frontside of the semiconductor component;

providing a first encapsulant disposed around and contacting at least four side surfaces of the semiconductor component, disposed over the frontside of the semiconductor component, and disposed so as to contact at least a portion of a side surface of the conductive studs;

forming a first layered structure as a build-up interconnect structure over the first encapsulant and over the semiconductor component, wherein forming the first layered structure comprises:

forming a first conductive layer comprising a redistribution layer (RDL) disposed over the first encapsulant and coupled with the conductive studs, forming a first dielectric layer over the first conductive layer, forming conductive stumps coupled to the first conductive layer and exposed with respect to the first dielectric layer, disposing a second encapsulant over the first conductive layer, over the first dielectric layer, and over the conductive stumps, and planarizing an upper surface of the second encapsulant to expose the conductive stumps and to create a flat upper surface on which to form additional structures;

forming a second layered structure as a build-up interconnect structure over the first layered structure and on the flat upper surface to improve a flatness of the second layered structure, wherein forming the second layered structure comprises:

forming a second conductive layer over the first layered structure, forming a second dielectric layer disposed over the second conductive layer, and forming a third encapsulant comprising a planarized upper surface disposed over the second conductive layer and over the second dielectric layer; and wherein a portion of the second encapsulant forms a multi-layer encapsulant body that passes through at least a portion of the first conductive layer and the first dielectric layer to directly contact the first encapsulant, and

a portion of the third encapsulant forms a portion of the multi-layer encapsulant body and passes through at least a portion of the second conductive layer and the second dielectric layer to directly contact the second encapsulant; and wherein the second encapsulant and the third encapsulant are formed without semiconductor chips disposed therein.

13. The method of claim 12, wherein the first conductive layer is formed directly on the first encapsulant without an interstitial dielectric layer.

14. The method of claim 12, further comprising forming package interconnects over the second layered structure and over the planarized upper surface, wherein the package interconnects comprise one or more of solder bumps, pins, a land grid array (LGA), or a ball grid array (BGA).

15. The method of claim 12, further comprising:

forming one or more additional conductive layers over the first dielectric layer, over the second dielectric layer, or over both the first dielectric layer and over the second dielectric layer; and

forming one or more of the second encapsulant and the third encapsulant over, and directly contacting, the one or more additional conductive layers.

16. The method of claim 12, wherein the conductive studs comprise solderless interconnects formed over and coupled to the frontside of the semiconductor component.

17. The method of claim 12, further comprising:

forming the first dielectric layer such that a portion of the first dielectric layer is in contact with a lower portion of a sidewall of the conductive stumps; and disposing the second encapsulant such that a portion of the second encapsulant is in contact with an upper portion of the sidewall of the conductive stumps.

18. The method of claim 12, further comprising forming a backside layered structure over a backside of the semiconductor component.

19. The method of claim 12, wherein an interstitial dielectric layer is disposed between the first encapsulant and the first conductive layer.

20. The method of claim 19, wherein one or more of the first dielectric layer, the second dielectric layer, and the interstitial dielectric layer comprise polyimide.

* * * * *